United States Patent
Pettis et al.

(10) Patent No.: US 9,476,657 B1
(45) Date of Patent: Oct. 25, 2016

(54) CONTROLLING DATA CENTER COOLING SYSTEMS

(71) Applicant: Google Inc., Mountain View, CA (US)

(72) Inventors: Nathaniel Edward Pettis, San Jose, CA (US); Andrew H. Tibbits, San Francisco, CA (US)

(73) Assignee: Google Inc., Mountain View, CA (US)

( * ) Notice: Subject to any disclaimer, the term of this patent is extended or adjusted under 35 U.S.C. 154(b) by 423 days.

(21) Appl. No.: 14/085,066

(22) Filed: Nov. 20, 2013

Related U.S. Application Data

(60) Provisional application No. 61/778,741, filed on Mar. 13, 2013.

(51) Int. Cl.
*F28F 27/02* (2006.01)
*G05D 23/19* (2006.01)
*H05K 7/20* (2006.01)

(52) U.S. Cl.
CPC ........... *F28F 27/02* (2013.01); *G05D 23/1917* (2013.01); *H05K 7/208* (2013.01); *H05K 7/20836* (2013.01)

(58) Field of Classification Search
CPC ............. G05D 23/1917; G05D 23/00; H05K 7/20218; H05K 7/20281; H05K 7/2029; H05K 7/20836; H05K 7/2074; H05K 7/20318; H05K 7/208; F28F 27/02
See application file for complete search history.

(56) References Cited

U.S. PATENT DOCUMENTS

| | | | | |
|---|---|---|---|---|
| 6,418,539 B1* | 7/2002 | Walker | ................ | G06F 11/2058 714/5.1 |
| 7,883,023 B1* | 2/2011 | Kainer | ............... | H05K 7/20836 165/247 |
| 9,158,345 B1* | 10/2015 | Rice | ..................... | H04L 41/0253 |
| 2008/0183307 A1* | 7/2008 | Clayton | .............. | G05B 19/042 700/8 |
| 2009/0218078 A1 | 9/2009 | Brunschwiler et al. | | |
| 2010/0106464 A1 | 4/2010 | Hlasny et al. | | |
| 2010/0126696 A1* | 5/2010 | Novotny | ............ | H05K 7/20709 165/67 |
| 2010/0131109 A1 | 5/2010 | Rasmussen et al. | | |
| 2011/0256822 A1* | 10/2011 | Carlson | ............. | H05K 7/20827 454/184 |
| 2012/0005344 A1* | 1/2012 | Kolin | ................. | H05K 7/20836 709/226 |
| 2013/0030585 A1 | 1/2013 | Rasmussen et al. | | |
| 2014/0020885 A1* | 1/2014 | Chainer | ............. | H05K 7/20836 165/287 |
| 2014/0124190 A1* | 5/2014 | Campbell | ......... | H05K 7/20281 165/296 |

FOREIGN PATENT DOCUMENTS

WO    WO2011/124696    * 10/2011    ............... F03D 7/04

* cited by examiner

*Primary Examiner* — Nathan L Laughlin
(74) *Attorney, Agent, or Firm* — Fish & Richardson P.C.

(57) ABSTRACT

Techniques for controlling a data center cooling system include polling a plurality of control devices associated with the data center cooling system for a respective state of each of the control devices; receiving, from each of the plurality of control devices, a response that includes the respective state; aggregating the responses from the plurality of control devices; executing a control algorithm that includes the aggregated responses as an input to the algorithm and an output that includes a setpoint of the plurality of control devices; and transmitting the output to the plurality of control devices.

25 Claims, 12 Drawing Sheets

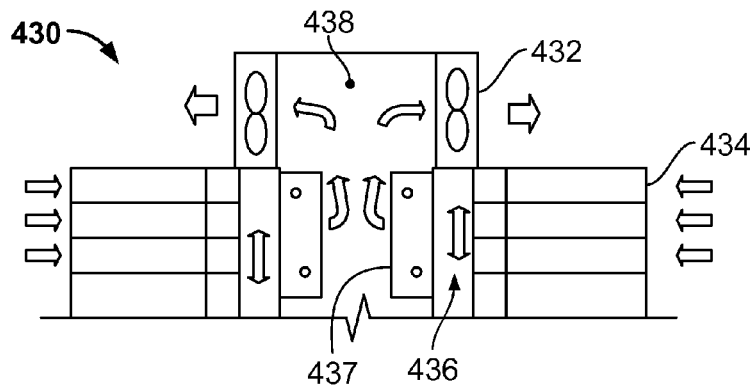
FIG. 4A
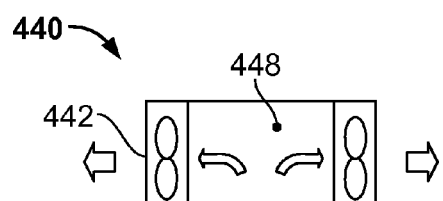
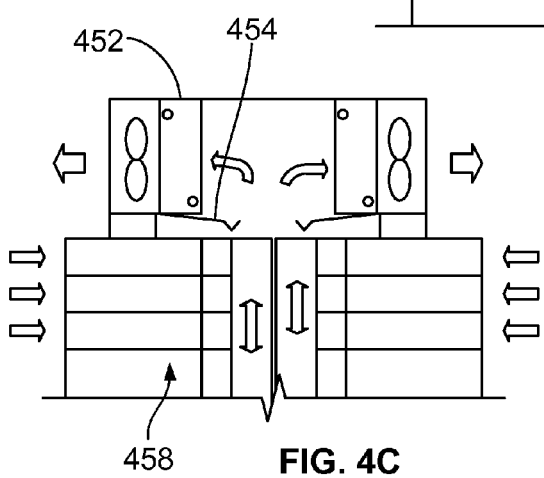
FIG. 4B
FIG. 4C

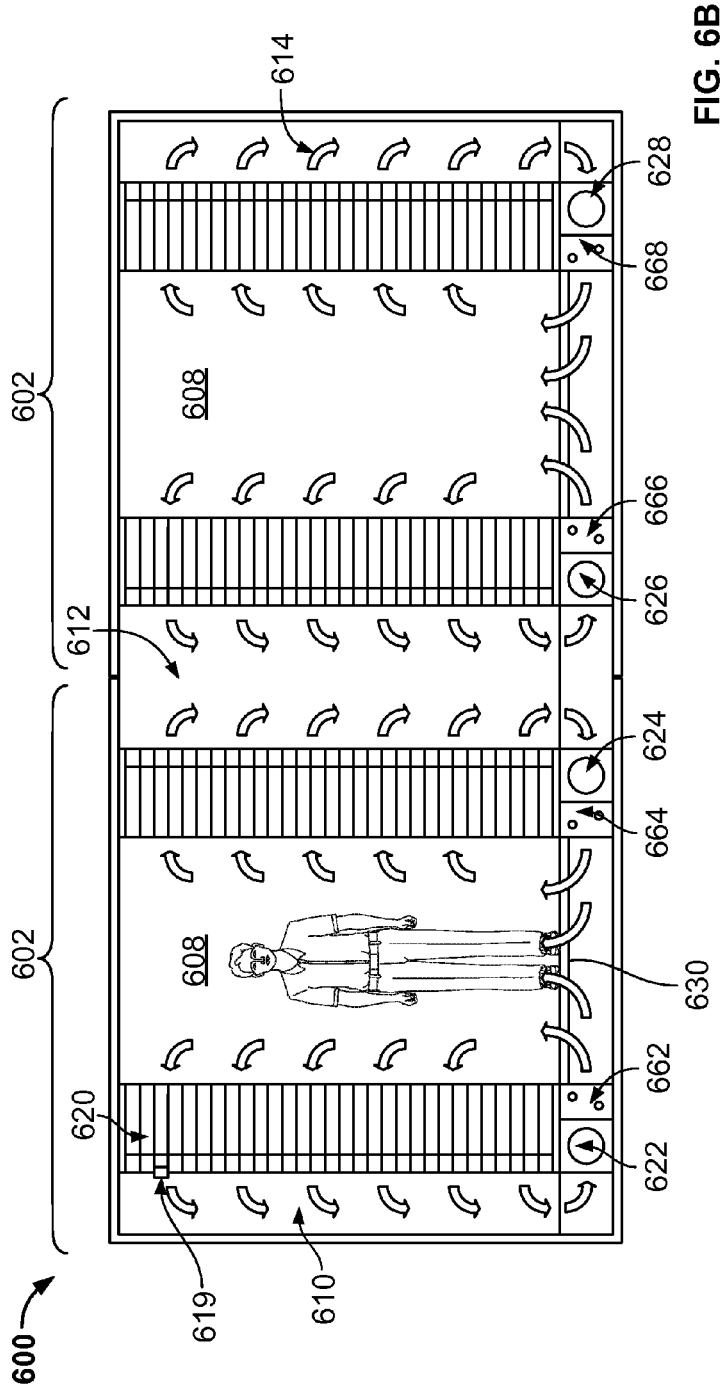
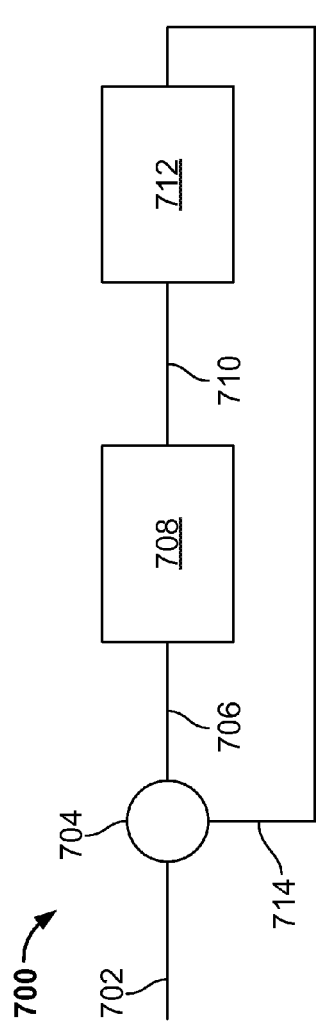
FIG. 6B
FIG. 7

CONTROLLING DATA CENTER COOLING SYSTEMS

CROSS REFERENCE TO RELATED APPLICATION

This application claims priority under 35 U.S.C. §119 to U.S. Provisional Patent Application Ser. No. 61/778,741, filed Mar. 13, 2013, the entire contents of which is incorporated by reference herein.

TECHNICAL BACKGROUND

This disclosure relates to systems and methods for controlling systems and equipment that provide cooling for areas that contain electronic equipment, such as computer server rooms and server racks in computer data centers.

BACKGROUND

Computer users often focus on the speed of computer microprocessors (e.g., megahertz and gigahertz). Many forget that this speed often comes with a cost—higher power consumption. For one or two home PCs, this extra power may be negligible when compared to the cost of running the many other electrical appliances in a home. But in data center applications, where thousands of microprocessors may be operated, electrical power requirements can be very important.

Power consumption is also, in effect, a double whammy. Not only must a data center operator pay for electricity to operate its many computers, but the operator must also pay to cool the computers. That is because, by simple laws of physics, all the power has to go somewhere, and that somewhere is, in the end, conversion into heat. A pair of microprocessors mounted on a single motherboard can draw hundreds of watts or more of power. Multiply that figure by several thousand (or tens of thousands) to account for the many computers in a large data center, and one can readily appreciate the amount of heat that can be generated. It is much like having a room filled with thousands of burning floodlights. The effects of power consumed by the critical load in the data center are often compounded when one incorporates all of the ancillary equipment required to support the critical load.

Thus, the cost of removing all of the heat can also be a major cost of operating large data centers. That cost typically involves the use of even more energy, in the form of electricity and natural gas, to operate chillers, condensers, pumps, fans, cooling towers, and other related components. Heat removal can also be important because, although microprocessors may not be as sensitive to heat as are people, increases in temperature can cause great increases in microprocessor errors and failures. In sum, a data center requires a large amount of electricity to power the critical load, and even more electricity to cool the load.

SUMMARY

General implementations for controlling a data center cooling system include polling a plurality of control devices associated with the data center cooling system for a respective state of each of the control devices; receiving, from each of the plurality of control devices, a response that includes the respective state; aggregating the responses from the plurality of control devices; executing a control algorithm that includes the aggregated responses as an input to the algorithm and an output that includes a setpoint of the plurality of control devices; and transmitting the output to the plurality of control devices.

In a first aspect combinable with any of the general implementations, the plurality of control devices include a plurality of control valves, each of the control valves in fluid communication with a cooling fluid source and at least one cooling coil mounted in a modular cooling apparatus.

In a second aspect combinable with any of the previous aspects, each respective state includes a valve position of each respective control valve.

In a third aspect combinable with any of the previous aspects, the setpoint includes a new valve position of each respective control valve.

In a fourth aspect combinable with any of the previous aspects, executing a control algorithm includes determining a temperature of air leaving each respective modular cooling unit; determining a temperature of the cooling fluid circulated to each respective modular cooling unit through the respective control valves; determining an approach temperature that includes a difference between the temperature of the air leaving each respective modular cooling unit and the temperature of the cooling fluid circulated to each respective modular cooling unit; and determining the new valve position based on the determined approach temperature and an approach temperature setpoint.

In a fifth aspect combinable with any of the previous aspects, polling a plurality of control devices associated with the data center cooling system includes polling a plurality of controllers communicably coupled to the plurality of control devices by a proxy, the proxy executed on at least one rack-mounted computing device of the data center.

A sixth aspect combinable with any of the previous aspects further includes partitioning the at least one rack-mounted computing device into an authenticated portion and an unauthenticated portion, the authenticated portion executing a plurality of processing jobs received from networked computing devices external to the data center; and routing the responses and output through the unauthenticated portion.

A seventh aspect combinable with any of the previous aspects further includes executing a second control algorithm that includes the aggregated responses as a second input to the second algorithm and a second output that includes the setpoint of the plurality of control devices; storing the second output; and based on a failure to transmit the output to the plurality of control devices, transmit the stored second output to the plurality of control devices.

In an eighth aspect combinable with any of the previous aspects, the second output is stored in a database that is physically separated from the data center.

A ninth aspect combinable with any of the previous aspects further includes determining a failure mode; and based on the failure mode, reverting the plurality of control devices to respective fail safe positions.

Various implementations of systems and methods for controlling equipment that provide cooling for areas containing electronic equipment may include one or more of the following advantages. For example, a computing framework may be provided that is distributed (e.g., across physical and geographic domains) and failure tolerant (e.g., including redundant data pipelines and computations). For example, the framework may be decentralized, both geographically and within a particular cooling device domain, thereby providing for failsafe and redundant design. Further, there may be one or more replica frameworks that provide for parallel processing of the cooling system control, thereby ensuring that a failure of one framework does not affect a cooling system at a particular data center. Such failures can be accounted for on the order of seconds (e.g., by failing over to a replica framework at another geographic location or the same geographic location). As another example, the framework may be highly scalable. For example, due to the parallelized nature of the framework, parallel computations on a large number of devices (e.g., valves, motors, fan coil units, lights, doors, and otherwise) may be performed by dividing the devices into smaller sets. Thus, performance constraints of conventional building automation systems (BAS) may be avoided. As another example, the framework may be modular and extensible. For instance, new control algorithms may be quickly added by creating smaller binaries and linking their data streams together. As another example, the framework may provide for secure communications between, for example, controllers of data center infrastructure equipment (e.g., cooling equipment, lighting equipment, and otherwise) and computational software that is executed to control such equipment. For instance, the framework may implement a proxy that provides for secure pass through communications between the controllers and the computational software in an otherwise secure environment (e.g., secure against cyber-attacks originating external to the data center).

These general and specific aspects may be implemented using a device, system or method, or any combinations of devices, systems, or methods. For example, a system of one or more computers can be configured to perform particular actions by virtue of having software, firmware, hardware, or a combination of them installed on the system that in operation causes or cause the system to perform the actions. One or more computer programs can be configured to perform particular actions by virtue of including instructions that, when executed by data processing apparatus, cause the apparatus to perform the actions. The details of one or more implementations are set forth in the accompanying drawings and the description below. Other features, objects, and advantages will be apparent from the description and drawings, and from the claims.

DESCRIPTION OF DRAWINGS

FIGS. 4A-4C illustrate example implementations of a portion of a data center cooling apparatus positioned adjacent a pair of racks;

FIGS. 6A-6B show plan and sectional views, respectively, of a modular data center system;

FIG. 7 illustrates an example control loop for controlling a data center cooling apparatus;

DETAILED DESCRIPTION

This disclosure relates to systems and methods for controlling a cooling system or other infrastructure system (e.g., lighting system, building management system, or otherwise) in a data center. In some aspects, the systems and method include a software framework that, for example, can be executed on one or more computing devices, such as, for instance, one or more rack-mounted computing devices in the data center. The software framework polls multiple controllers that are communicably coupled to controlled/actuatable devices (e.g., valves, fans, pumps, lights, doors, and otherwise) for their respective states. The state data may be aggregated and fed into one or more control algorithms to determine a new and/or adjusted setpoint for the devices. The new and/or adjusted setpoint is communicated back to the controlled devices.

Figure 1A:
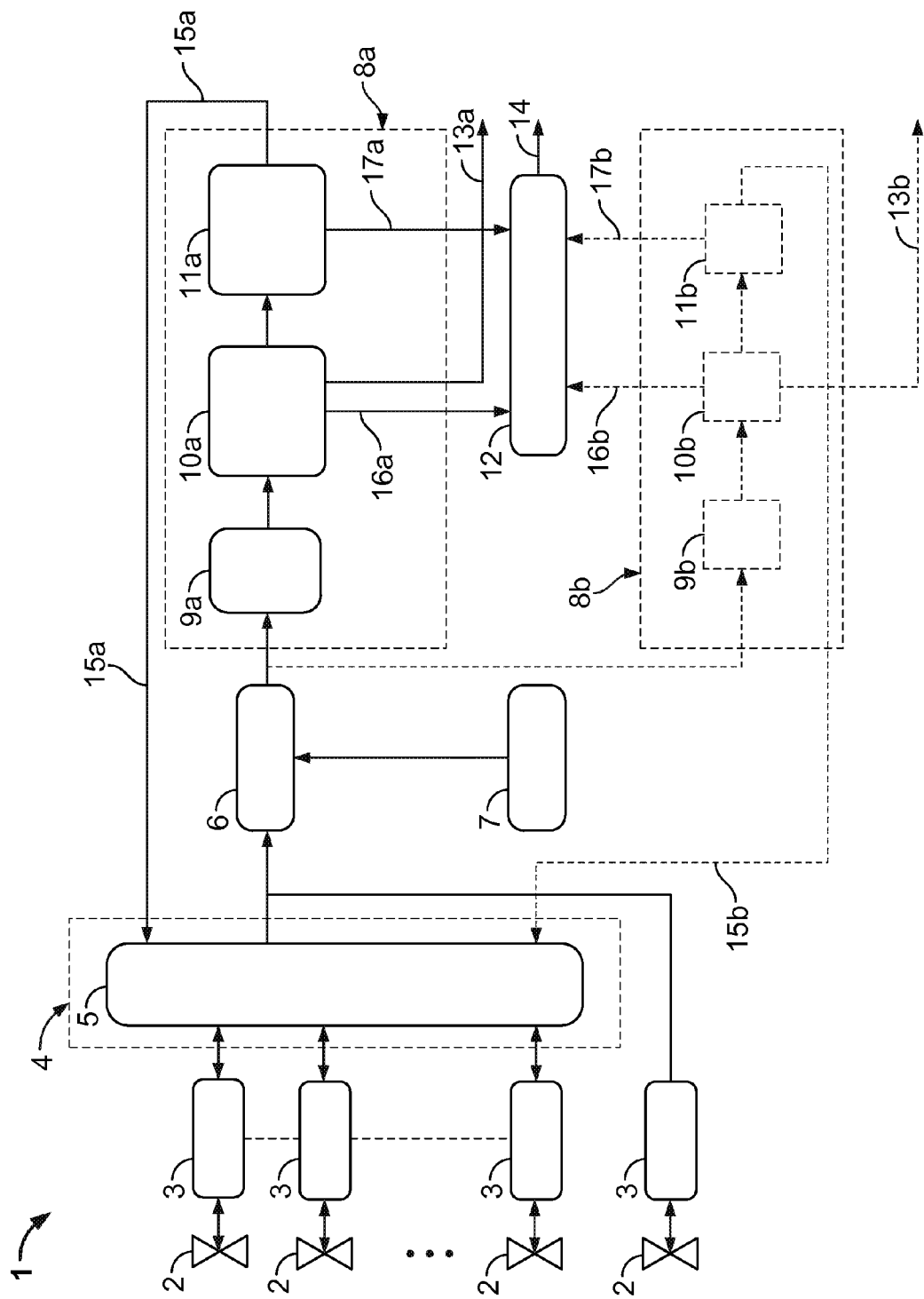
FIG. 1A illustrates an example computer-implemented system for controlling a cooling system for a data center.

FIG. 1A illustrates an example computer-implemented system 1 for controlling a cooling system for a data center. The system 1, as illustrated, includes a computer-implemented framework that is operable to receive data associated with one or more devices of the cooling system (e.g., valves, fans, humidifiers, chillers, cooling towers, and otherwise), as well as one or more devices associated with an infrastructure of the data center (e.g., lights, doors, and otherwise) and implement instructions back to such devices (e.g., setpoint values) in real time (e.g., in seconds or less) or near real time (e.g., in seconds or tens of seconds).

System 1, as illustrated, includes a number of valves 2 communicably coupled to valve controllers 3. Although this example uses "valves" for illustrative purposes of the system 1, any controlled device or apparatus (e.g., fans, pumps, temperature sensors, humidity sensors, lights, doors, and otherwise) may be implemented within the system 1. Likewise, the valve controllers 3 may be specific to the type of controlled device being implemented within the system 1.

Although only a few valves 2 in bi-directional communication with respective valve controllers 3 are illustrated, a particular data center may have thousands (if not more) of valves and controllers, depending on, for instance, the size of the data center, cooling requirements of the data center, and/or power capacity limitations of the data center. As shown in FIG. 3B, for instance, a data center may include many cooling apparatus 302, each with an associated valve 318 (e.g., to modulate a cooling fluid) and controller 324.

One or more of the valve controllers 3 are communicably coupled to a proxy 5 that is implemented on an authenticated apparatus 4. At a high level, the authenticated apparatus 4 is a microprocessor-based computing device (e.g., rack mounted server, stand-alone server or client, desktop, laptop, mobile device, tablet, or otherwise). In some examples, the authenticated apparatus 4 comprises one or more rack mounted computing devices that are part of an information technology (IT) capacity of the data center itself, such as, for example, racks 115, racks 202*a*-202*b*, and racks 304 discussed below. In other words, the authenticated apparatus 4 may comprise multiple processing devices that also process computing loads associated with the data center (e.g., search functions, mail functions, and otherwise). The authenticated apparatus 4, therefore, may represent a stand-alone computing apparatus or an amount of processing power spread across multiple computing devices in order to, for instance, increase speed and responsiveness.

As illustrated, one of the valve controllers 3 is in direct communication with the injector 6 (e.g., outside of the proxy 5). For example, in the case of system 1 being implemented on a stand-alone apparatus, such as a dedicated BAS computing device, the proxy 5 may be removed to allow for such direct communication.

The proxy 5 provides secure communication of data passed by the valve controllers 3 to other portions of the system 1. For example, in cases where the authenticated apparatus 4 is not a stand-alone machine (e.g., a dedicated BAS machine), secure communications between the valve controllers 3 and, for example, an injector 6 that go through the authenticated apparatus 4 may be separated from other communications and data on the authenticated apparatus 4 by the proxy 5.

The injector 6 receives data from the valve controllers 3 through the proxy 5 that describes a current status of the valves 2. For example, in this illustrated implementation, the valves 2 may communicate (e.g., upon being polled by the controllers 3) a valve-by-valve position to the injector 6. Other data may also be communicated to the injector 6 as dictated, for example, by one or more rules or control algorithms implemented in a device doctor 8a. Such information may include, for instance, a temperature of a cooling medium (e.g., chilled water or other cooling fluid flow). The device doctor 8a, for example, may be implemented specific to a particular control purpose. For instance, in this example, the device doctor 8a may implement a framework to maintain a static or dynamic approach temperature that is defined by a difference between a leaving air temperature of a cooling apparatus and an entering cooling fluid temperature of the cooling apparatus, of which the valve 2 is a part (e.g., valve 318 that is part of the cooling apparatus 302). Each valve 2 can be in fluid communication with a cooling coil of a cooling apparatus and may modulate a flow of cooling fluid to the coil. The controller 3 that is communicably coupled to the valve 2 controls the valve 2 to modulate the flow of cooling fluid to maintain the approach temperature set point. In some implementations, the controller(s) 3 may modulate the valves 2 based on a change to the approach temperature set point as determined, for instance, by the device doctor 8a. The setpoint can then be changed by the system 1, and the valve 2 may then be controlled to maintain the new setpoint temperature.

In the illustrated implementation of system 1, a domain group module 7 may be communicably coupled to the injector 6. In some aspects, the domain group module 7 may include or comprise a publisher-subscriber system that broadcasts, e.g., to the injector 6 or other portions of the system 1, a change (e.g., an addition or subtraction) to a number of controllers 3 in the system 1. The injector 6 (and system 1) therefore, is ensured that communication occurs with only active controllers 3 and not controllers 3 that have been removed (e.g., physically or virtually) from the system 1.

The injector 6 is communicably coupled to a rules engine 9a in the device doctor 8a to provide, for example, aggregated data (e.g., valve positions) from the valves 2 to the rules engine 9a. At a high level, the rules engine 9a may include a set of rules that, when evaluated by the engine 9a, ensure availability of the valves 2 in order to implement one or more control algorithms. For example, if, in response to polling by the valve controllers 3, a large number or percentage of the valves 2 are non-responsive, the rules engine 9a may cease to implement any control algorithms (e.g., to implement dynamic approach control as described above) or may simply drop the particular non-responsive valves 2 from further analysis or control. In the illustrated, implementation, the rules engine 9a may be specific to the particular controlled device; in this example, the valves 2.

In other examples, such as when the controlled device may be a fan motor, a variable frequency drive, a pump motor, a light or set of lights, a door or set of doors, the rules engine 9a may include different rules that, when evaluated by the engine 9a, may ensure availability of the controlled device.

The rules engine 9a passes the data from the valves 2 to a control engine 10a that is, in some aspects, specific to the controlled device (e.g., the valves 2). For example, in some aspects, the device doctor 8a may include several rules engines 9a and several control engine 10a, each of them specific to a particular controlled device (e.g., a valve, a fan motor, a pump motor, or otherwise). In this way, for instance, the system 1 may be easily scalable when controlled devices are added to the system 1 and/or control algorithms are added or changed.

Figure 8:
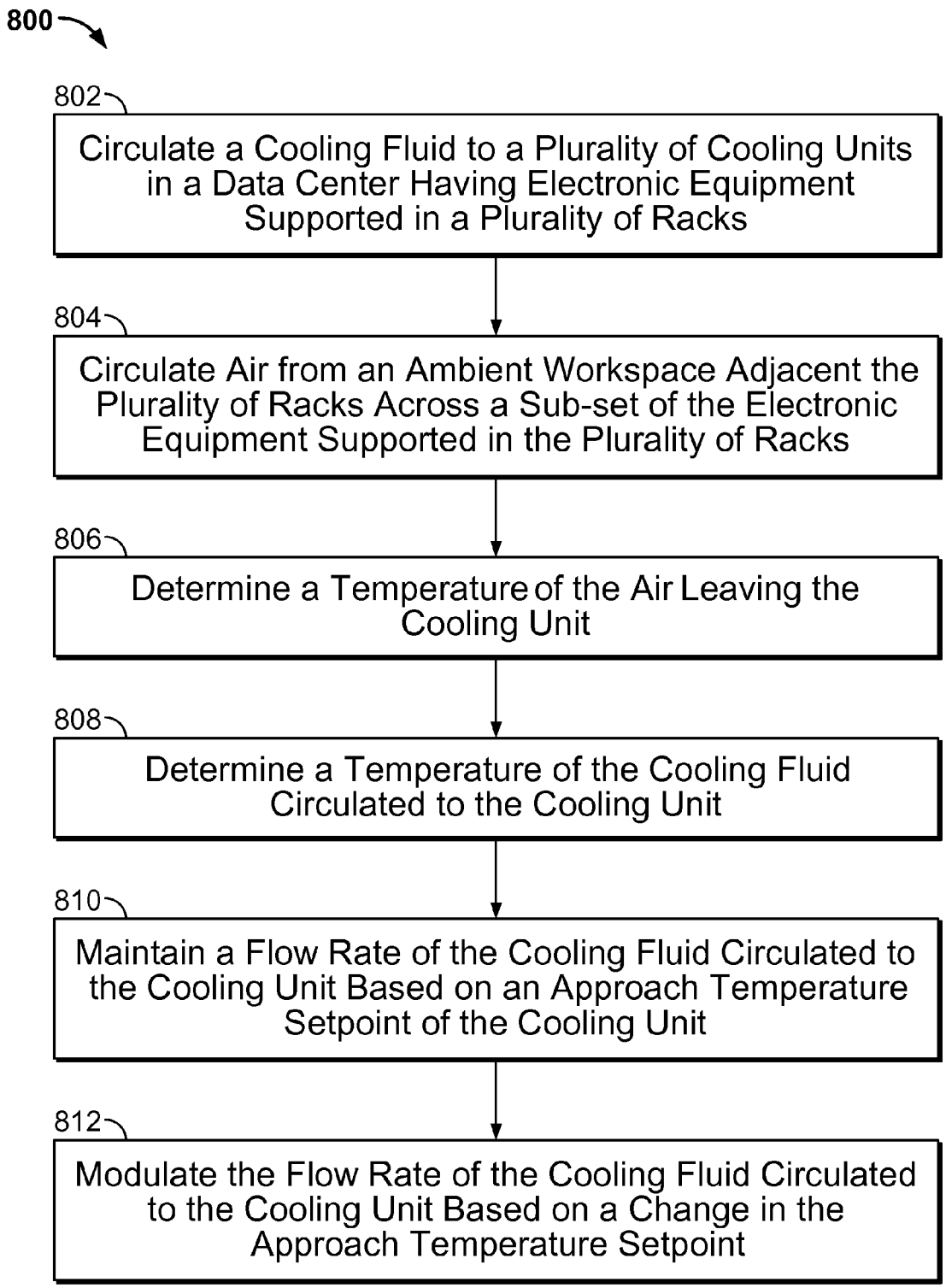
FIG. 8 illustrates an example process for cooling a data center based on an approach temperature.
Figure 9:
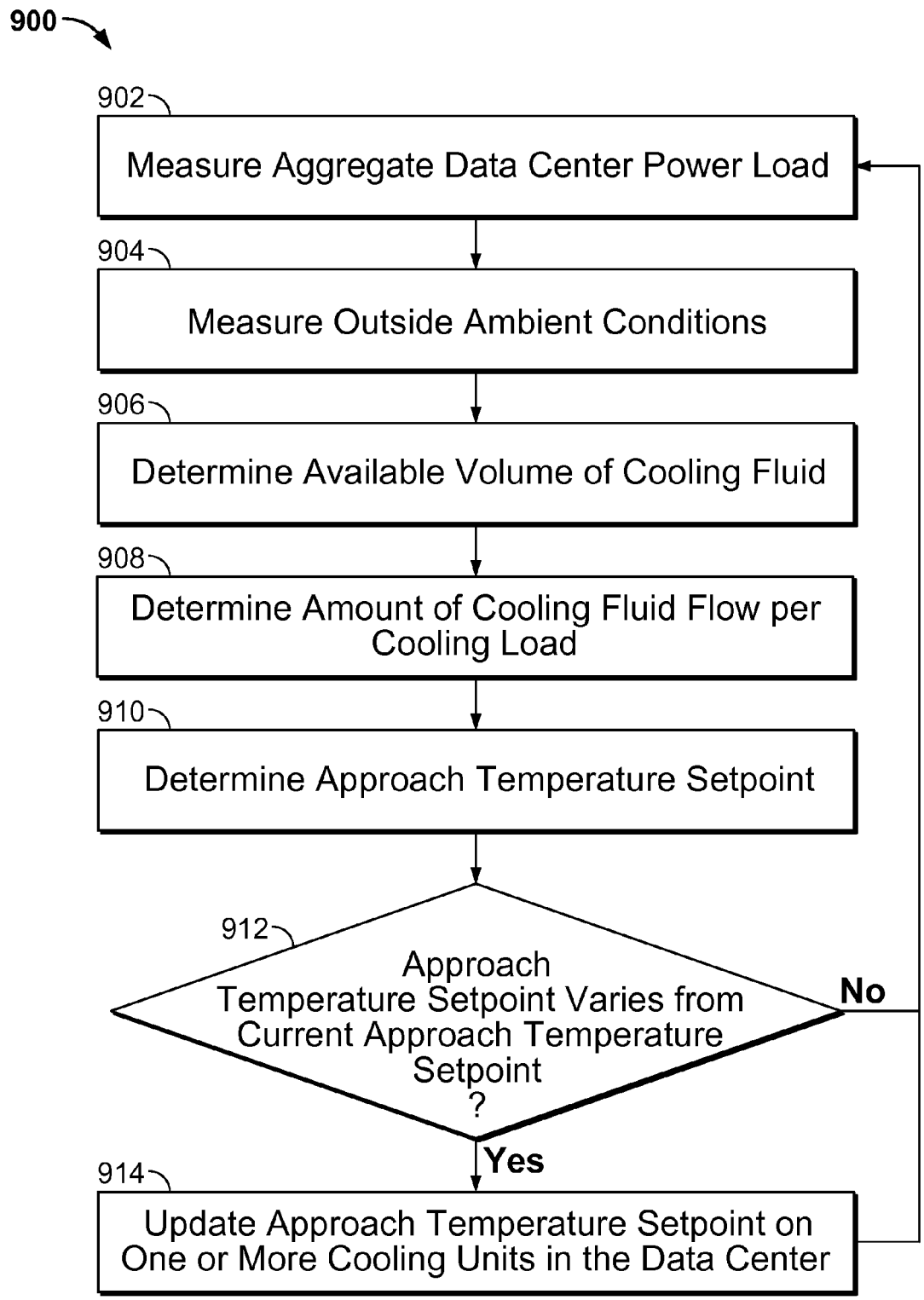
FIGS. 9-10 illustrate example processes for adjusting an approach temperature to cool a data center.
Figure 10:
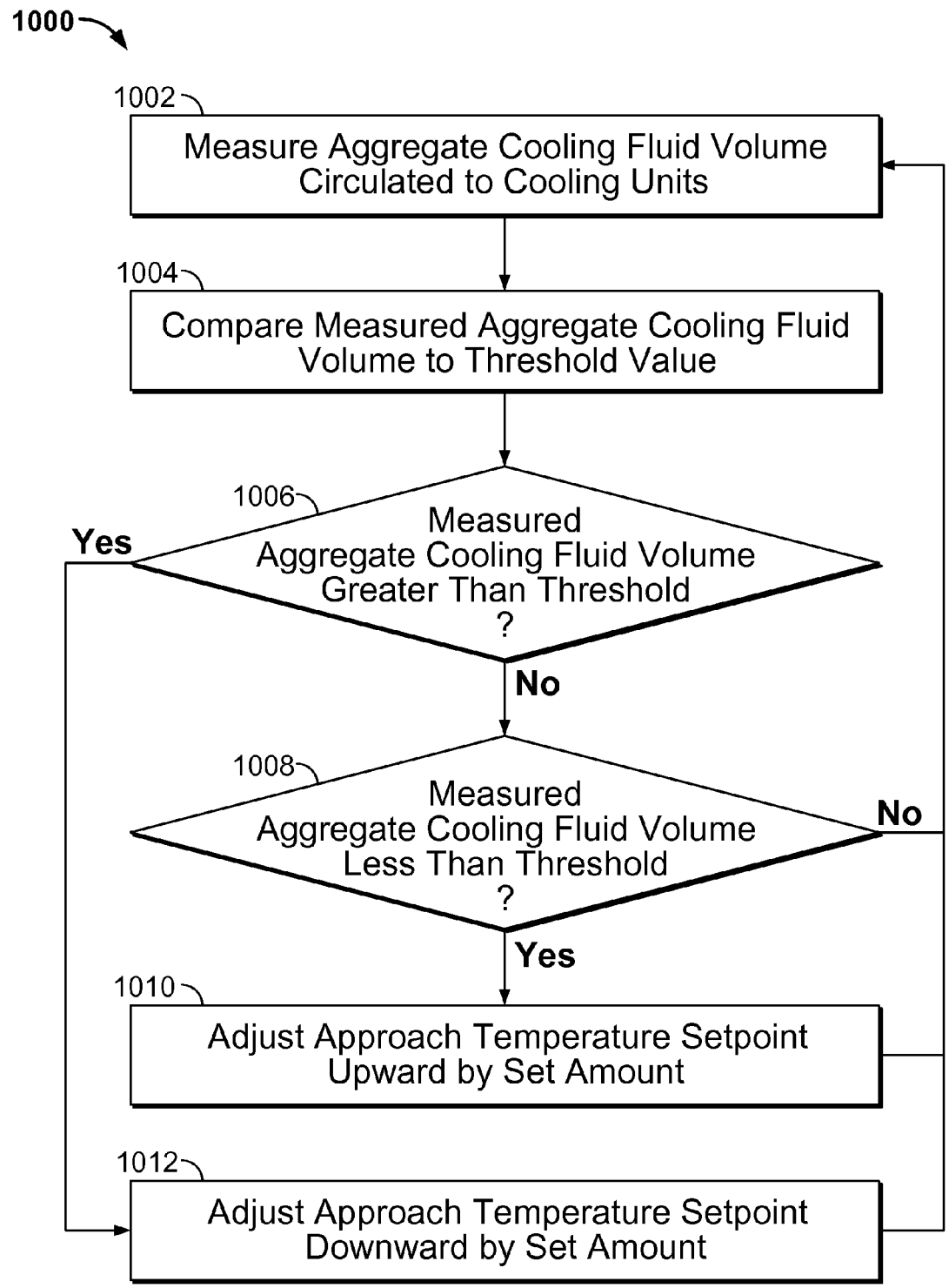

In the illustrated example, the control engine 10a may receive data representative of the valve positions, as well as, in some aspects, other data such as an entering cooling fluid temperature to a cooling coil fluidly coupled to the valves 2, and produce a setpoint position for the valves 2 (e.g., all of or a portion of the valves 2) based on a dynamic approach algorithm. For example, FIG. 7 shows an example control loop 700 that may be implemented by the control engine 10a. Further, FIGS. 8-10 illustrates example processes 800, 900, and 1000, respectively, that may be implemented by the control engine 10a. As shown, outputs 16a and 13a of the control engine 10a can be passed to other portions of the system 1 or outside of the system 1 (e.g., in the case of output 13a)

The control engine 10a passes its output (e.g., a new, adjusted, or different valve position setpoint) to a proxy extractor 11a. The proxy extractor 11a takes the output and places it in a readable message 15a that is passed back to the proxy 5 for further communication to the valve controllers 3. In some instances, the proxy extractor 11a determines all of the devices (e.g., the valves 2) that are to receive the new position command. For instance, all of the valves 2 in a data center may be divided into separate groups or domains. In some instances, only some groups or domains of the valves 2 may be adjusted by the readable message 15a while other groups or domains of the valves 2 may remain in their set position.

Actuation of the valves 2 (e.g., adjustment of their position) may be performed by the proxy 5 according to the readable message 15a. In one example end-to-end latency, the controllers 3 sample the valves 2 (e.g., to receive position feedback) about every 2 ms. Then, the proxy 5 batches the feedback from all of the controllers 3 (e.g., up to, in some aspects, 800 controllers 3) about every 5 seconds for communication to the injector 6. The batched feedback from the proxy 5 may be transmitted to the injector 6 at intervals of about 30 seconds. Next, the device doctor 8a performs the above-described operations over a period of between 5 seconds and 20 minutes.

Other sampling schedules are also possible. For example, in another example end-to-end latency, the controllers 3 sample the valves 2 (e.g., to receive position feedback) about every 5 seconds. Then, the proxy 5 batches the feedback from all of the controllers 3 (e.g., up to, in some aspects, 800 controllers 3) about every 20 seconds for communication to the injector 6. The batched feedback from the proxy 5 may be transmitted to the injector 6 at intervals of about 1-2 minutes. Next, the device doctor 8*a* performs the above-described operations over a period of between 5 minutes and 30 minutes.

In some aspects, the system 1 also includes a monitor 12 that is communicably coupled to the control engine 10*a* and proxy extractor 11*a* to receives outputs 16*a* and 17*a*, respectively. In some aspects, the monitor 12 analyzes the outputs 16*a* and 17*a* to ensure that the control engine 10*a* and 11*a* are functioning properly. In the case of a problem, the monitor 12, in some aspects, may stop the device doctor 8*a*. Once stopped, the valves 2 and/or valve controllers 3 may "fail" safe to a preprogrammed position or a preprogrammed control sequence.

Although illustrated as residing together in the device doctor 8*a* (e.g., being executed on the same computing device), each of the rules engine 9*a*, the control engine 10*a*, and the proxy extractor 11*a* may be executed on separate computing devices (e.g., separate rack-mounted computers in the data center or stand-alone machines). In some aspects, separation of the execution of such components can increase the speed and efficiency of the system 1.

In some aspects, as illustrated, the system 1 may include one or more redundant, or replicated, "b" components. In such aspects, for example, failure of "a" components (e.g., those designated with "a" references), such as, due to power problems, natural disasters, and otherwise. For example, as illustrated, replicated (or redundant) components include a device doctor 8*b*, a rules engine 9*b*, a control algorithm 10*b*, and a proxy extractor 11*b*, along with their associated communications (e.g., outputs 13*b* and 16*b* and readable message 15*b*). In some aspects, for instance, such replicated (or redundant) components may be executed simultaneously (e.g., substantially or otherwise) with the "a" components so that, in the case of failure of one or more "a" components, the system 1 can switchover to the "b" components in real time with no loss of execution. In particular, in some aspects, the "b" components may be physically located and executed separately from the "a" components (e.g., in a different building of the data center, on a different computing device than the "a" components, or in a different geographic region, such as at another data center or a main control building/system separated from the data center(s)).

In some aspects, the system 1 may experience one or more failure modes that, for example, cause a change of operation. For example, one failure mode may include an inability to change an approach control setpoint of a valve. In this mode, the controllers 3 may be preset to continue to execute a local control loops to respond to locally visible changes to thermal load (e.g., open as air temperature rises to provide more cooling fluid flow and close as air temperature lowers to provide less). The controllers 3 may be present, for example, by the system 1, to operate within a range of safe approach temperature values (e.g., between about 2° C. and 5° C., or between about 1-2° C., or between 1-7° C.) in order to, for instance, maintain machine thermal margins.

As another example failure mode, an individual controller 3 (e.g., for a fan coil unit having an associated valve 2) may be unreachable. When a controller 3 is unreachable, it is unable to receive commands from the proxy 5 (e.g., an adjusted setpoint command) or return valve position data to the proxy 5. In some aspects, in response to this failure mode, any further data from this controller 3 may be ignored, as in some aspects, any single valve 2 associated with the unreachable controller 3 could become completely closed without affecting cooling performance of the overall system.

Figure 5:
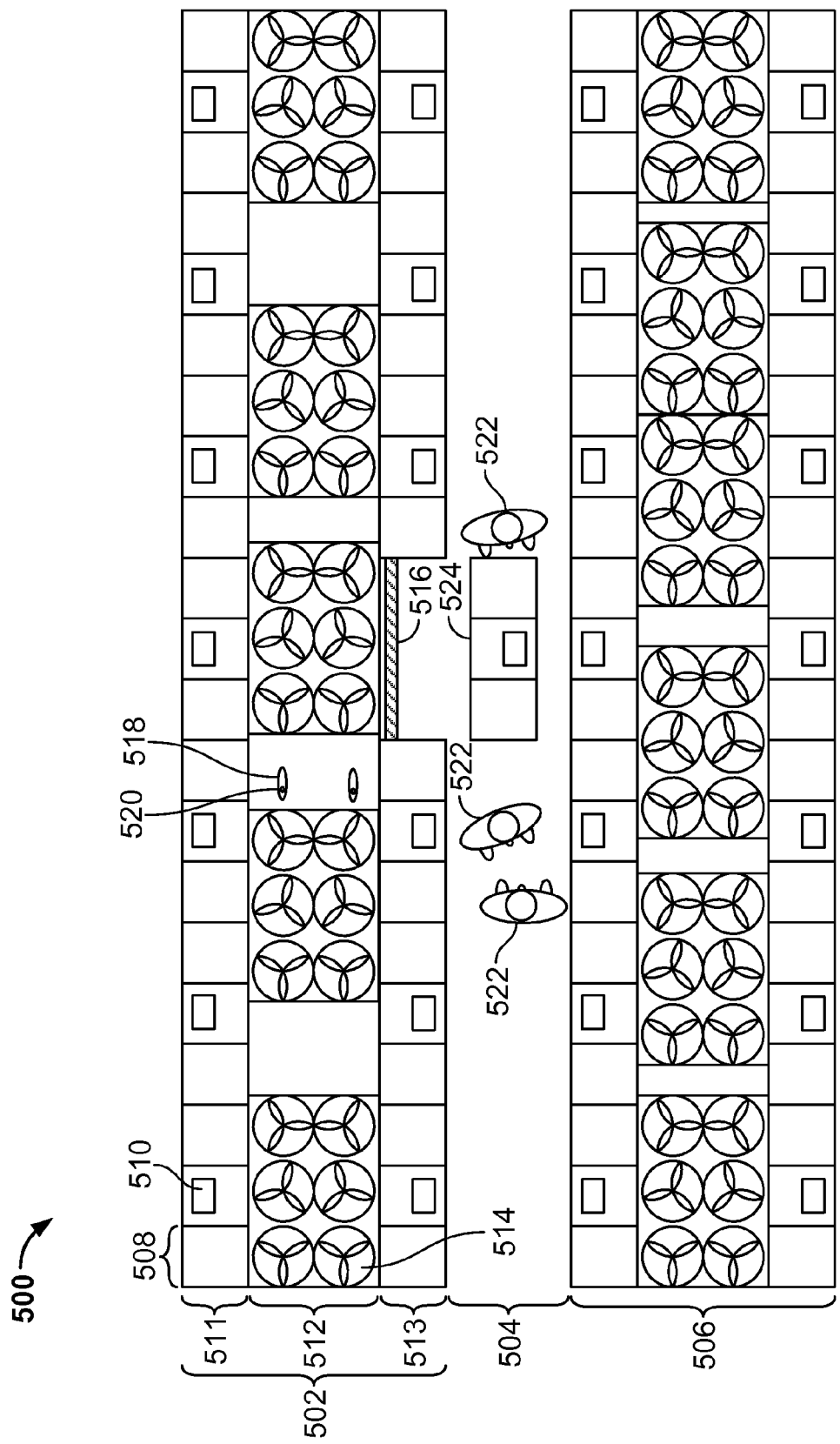
FIG. 5 shows a plan view of two rows in a computer data center with cooling modules arranged between racks situated in the rows.

As another example failure mode, multiple controllers 3 may become unreachable. In this situation, the failure mode may only occur if multiple controllers 3 associated with adjacent cooling units or fan coil units (e.g., as shown in FIG. 5) become unreachable. If non-adjacent controllers 3 become unreachable, this may be classified as an "individual failure" as described above. But when adjacent controllers 3 become unreachable, the problem is equivalent to the inability to change approach setpoints. In such cases, if the number of unreachable controllers 3 meets or exceeds a particular threshold (e.g., a percentage of a domain of controllers 3, such as controllers 3 associated with a row of fan coil units), then, for instance, all controllers 3 in the particular domain may be set to their respective safe state until sufficient controllers 3 become available to resume control.

As another example failure mode, the proxy 5 may be unreachable, thereby preventing the issuance of new commands to controllers 3. This may be equivalent to the inability to change approach setpoints. In such cases, controllers 3 may be reachable but may be reset to their safe state through a locally-executed script, if necessary. In some cases, alerts can be sent out (e.g., through the output 14 and/or output 13*a*) to human staff to begin resolution of the problem.

In another example failure mode, the control engine 10*a* may become unstable. If the control engine 10*a* becomes unstable due to perturbations or steady-state changes in facility behavior, the approach setpoint may oscillate or approach positive or negative values without bound. This may lead to insufficient cooling within a zone of a data center if left unattended for long periods of time without adequate protection. In some aspects, this failure mode is resolved by clamping the setpoint to a range of reasonable values as discussed above. For instance, if the setpoint remains clamped for a particular period of time (e.g., 12 consecutive hours), alert messages (e.g., through output 14) may be transmitted. In some aspects, approach setpoints can be monitored for unstable oscillations by monitoring a variance of the commanded setpoints in the device doctor 8*a*. If this variance exceeds a threshold over a period time (e.g., an hour), alerts can be made. If the oscillations become so great as to cause system instability, then system 1 can be shut-down to prevent damage, and the controllers 3 can control the valves 2 in their respective safe states.

As noted above, in some cases, alerts may be sent via the output 14, in the case of a failure mode or other data that needs to be communicated. For example, in some instances, the device doctor 8*a* may issue alerts related to the controllers 3, such as alerts related to thermal events (e.g., high heat zones) in the data center. As another example, the control engine 10*a* may issue alerts related to, for instance, engagement of a safe state by one or more controllers 3, setpoint oscillation, or setpoint clamping (e.g., limiting within a range). As another example, the proxy extractor 11*a* may issue alerts related to, for instance, unreachable timeouts of the extractor 11*a*, unreachable controllers 3, or a threshold of unreachable controllers 3 being met.

Implementations of system 1 and all of its functional operations provided herein can be realized in digital electronic circuitry, or in computer software, firmware, or hardware, including the structures disclosed in this specification and their structural equivalents, or in combinations of one or more of them. Implementations of the present disclosure can be realized as one or more computer program products, i.e., one or more modules of computer program instructions encoded on a computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more of them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this disclose can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. Elements of a computer can include a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a mobile telephone, a personal digital assistant (PDA), a mobile audio player, a Global Positioning System (GPS) receiver, to name just a few. Computer readable media suitable for storing computer program instructions and data include all forms of non volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

To provide for interaction with a user, implementations of the present disclosure can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

Figure 1B:
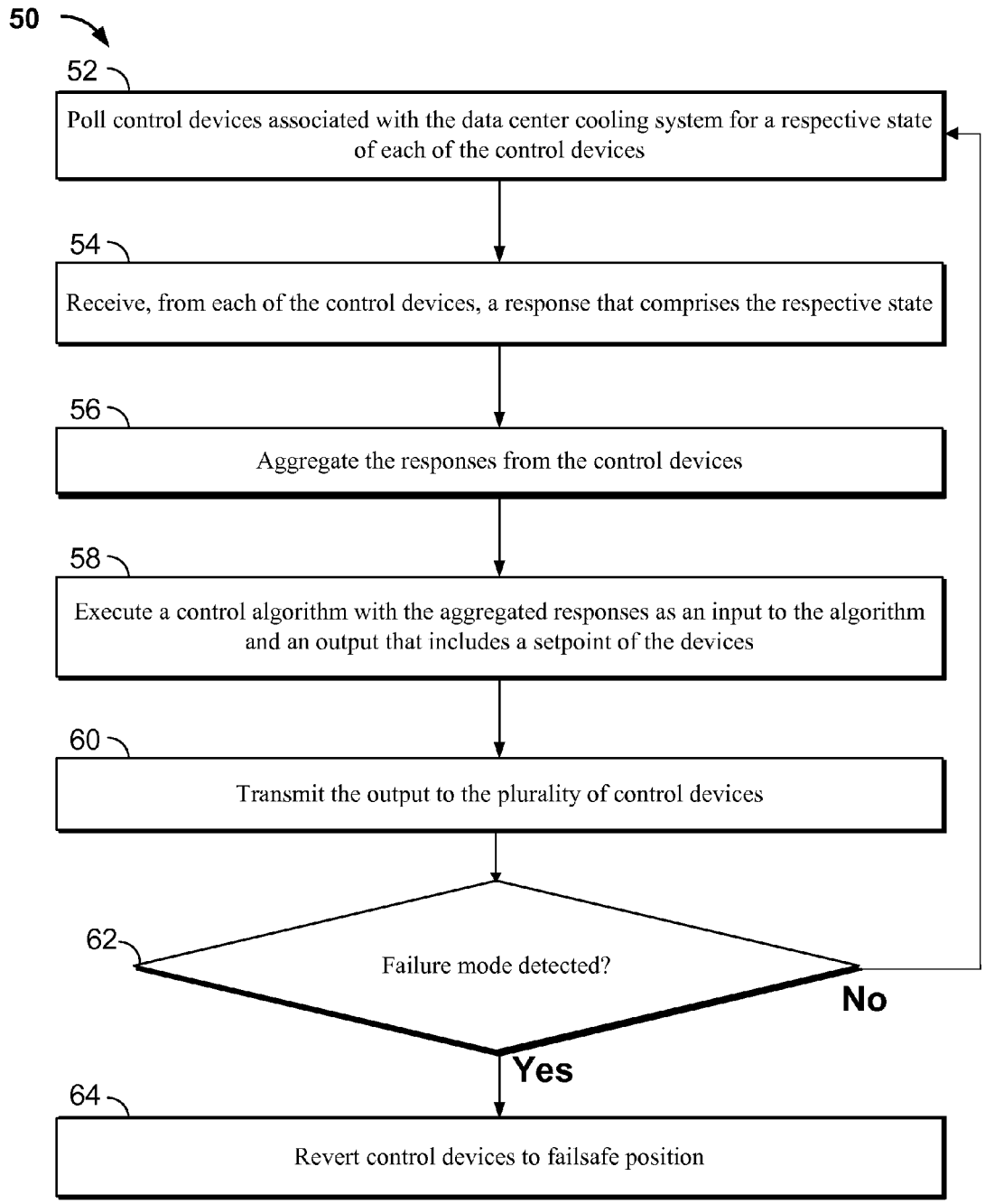
FIG. 1B illustrates an example method for controlling a cooling system for a data center.

FIG. 1B illustrates an example method 50 for controlling a cooling system for a data center. In some aspects, method 50 can be executed by all or a portion of the system 1 as illustrated in FIG. 1. Method 50 may begin at step 52, when control devices of a data center cooling system, such as valves, fans, pumps, or otherwise, are polled for a respective state of each device. In some aspects, as shown in FIG. 1, a proxy polls controllers that a communicably coupled to the devices and the controllers relay the state (e.g., position, on/off, speed, frequency, or otherwise) to the proxy.

In step 54, a response that includes the polled state data is received from each of the control devices (e.g., each that is responsive). For example, in the case of the control device being a valve in fluid communication with a modular cooling unit (e.g., a fan coil unit), the state data may include a position of the valve (e.g., percentage open). Other data may also be polled, transmitted to, or received by the proxy, such as, for example, temperature data of a fluid circulated through the valve and to the cooling unit.

In step 56, the responses from the control devices (e.g., from the controllers coupled to the devices) are aggregated. In some aspects, not all control devices respond and, therefore some control devices are left to operate in a failsafe or stand-alone mode (e.g., reacting to temperature changes in the fluid or other cooling medium). In some aspects, due to the large number of control devices (e.g., hundreds or thousands), the aggregation occurs on multiple rack-mounted computers that are part of the information technology (IT) processing power of the data center, rather than, for instance, a stand-alone BAS machine.

In step 58, a control algorithm is executed using the aggregated responses as at least a portion of an input to the algorithm. The algorithm outputs a value for a new and/or adjusted setpoint of the control devices. In some examples, the control algorithm may provide for dynamic approach control as described with reference to FIGS. 7-10. Other control algorithms, for instance specific to fans, pumps, lights, or doors of a data center, may also be executed. In step 60, the new and/or adjusted setpoint is transmitted back to the control devices (e.g., via associated controllers). In some aspects, the setpoint may be transmitted to the proxy for communication to the controllers.

In step 62, a decision is made whether a failure mode (e.g., as described above) is detected. If yes, then in step 64, the control devices may revert to a failsafe position as described above. If not, method 50 may return to step 52

Figure 2A:
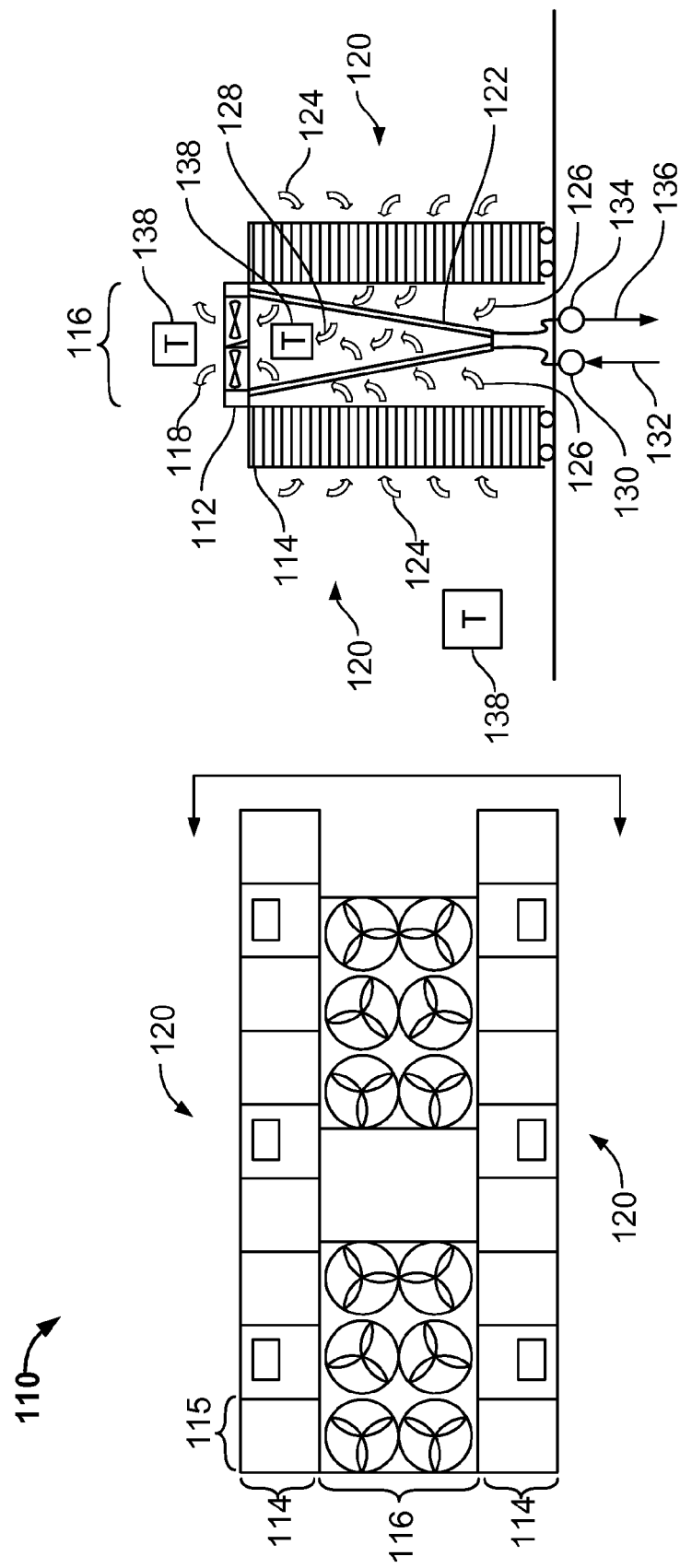
FIG. 2A illustrates a top and side view of an example implementation of a portion of a data center including a data center cooling apparatus.

FIG. 2A illustrates a top and side view of an example implementation of a portion of a data center 110 that includes a data center cooling apparatus 116. In some aspects, the portion of the data center 110 may also include system 1 as described above, in order to, for example, control one or more components, including the data center cooling apparatus 116. As illustrated, the data center 110 includes one or more rows 114 of computers that are supported in racks 115. The rows 114 are arranged substantially parallel with each other, and are each adjacent to aisles in a human-occupiable workspace 120. The computers that are supported in the racks 115, in some implementations, may be open to the human-occupiable workspace 120 such that an airflow may be circulated from the workspace 120 through the racks 116 during normal operation of the system, and so that technicians may access particular devices without having to substantially interfere with airflow over the other devices (such as would happen if the rack were sealed and the technician had to open a door to access one of the devices).

Data center 110 also includes one or more cooling units 116 arranged between adjacent pairs of the rows 114 of racks 115. The cooling units 116 are modular (and each is of like size), and the rows of racks "back up to" the cooling units 116 so that warmed air from the racks passes directly into the cooling units 116. As illustrated, each cooling unit 116 includes a number of fans 112 (e.g., six as illustrated) that are arranged to circulate air from the workspace 120, through the racks 115 arranged in the rows 114. As illustrated, the ambient air 124 is circulated through the racks 115 and heated by heat generating electronic devices (e.g., servers, processors, uninterruptible power supplies, and other devices) into heated airflow 26. The heated airflow 26 is circulated through one or more cooling coils 122 of the cooling unit 116 to a cooling airflow 128. The cooling airflow 128 is then circulated by the fans 112 to the workspace 120 as a leaving airflow 118 from the cooling units 116. In some implementations, a temperature of the cooling airflow 128 and the leaving airflow 118 may be substantially the same (e.g., where there is no electrical equipment or mixing with other air between the two). In some implementations, alternatively, the leaving airflow 118 may be slightly warmer than the cooling airflow 128 to account for, e.g., motor heat from fan motors (not shown) that drive the fans 112.

As illustrated, therefore, a volume defined between two substantially parallel rows 114 of racks 115 into which one or more cooling units 116 may be disposed may include one or more warm air plenums and one or more cool air plenums. For example, the warm air plenums may be defined by spaces into which the heated airflows 26 are circulated by the fans 112. The cool air plenums may be defined by spaces into which the cooling airflow 128 is circulated. Thus the cooling coils 122 may thermally separate the warm air plenums from the cool air plenums between the rows 114 of racks 115.

As illustrated, a cooling fluid supply 132 (e.g., chilled water, chilled glycol, condenser water, and/or a mix of one of more fluid flows) is circulated (e.g., pumped) to the cooling coils 122 through a cooling fluid supply conduit 130. After circulating through the cooling coils 122 so that heat from the heated airflow 26 is transferred to the cooling fluid supply 132, cooling fluid return 136 (i.e., the cooling fluid supply 132 leaving the cooling coils 122) is circulated from the cooling coils 122 and, for example, to a central cooling facility, via a cooling fluid return conduit 136. Although illustrated as arranged underneath a floor on which the rows 114 of racks 115 and the cooling units 116 are supported, the conduits 132 and/or 136 may be arranged in the workspace 120, above the cooling units 116, and/or in a separate overhead plenum.

The illustrated system also includes one or more temperature sensors 138. For example, as illustrated, a temperature sensor 138 may be positioned in one or more locations to measure the temperature of the leaving airflow 118 from the cooling units 116. In some implementations, a temperature of the cooling airflow 128, the leaving airflow 118, and the ambient airflow 124 of the workspace 120 may be substantially similar and/or equal. Thus, measuring any one of the temperatures of these airflows may at least approximate a leaving air temperature of the cooling units 116.

In operation, the cooling units 116 may be controlled (e.g., via one or more individual controllers and/or a main controller in the data center) to maintain a specified approach temperature. The approach temperature, in some implementations, may represent a difference between a temperature of an airflow leaving the cooling unit 116 (e.g., the cooling airflow 128, the leaving airflow 118, the ambient airflow 124, and/or an average airflow temperature determined from one or more of these airflow temperatures) and a temperature of the cooling fluid supply 132. In some implementations, such a control (e.g., approach control) may provide for the adjustment of an amount (e.g., GPM) of cooling fluid supply 132 flowing through the cooling coils 122 to maintain a specific approach temperature. In some implementations, this approach control may include, for example, servoing a cooling fluid control valve (e.g., with an individual or main controller) to stabilize the approach temperature to a desired value. For example, since the amount of cooling fluid supply 132 required to remove a particular amount of heat (e.g., kW) generated by electronic devices in the racks 115 is inversely related to the approach temperature, varying the approach temperature may provide a "knob" to adjust the required GPM/kW to remove the generated heat by flowing the cooling fluid supply 132 through the cooling coils 122.

In some implementations, at any given snapshot in time, some racks 115 in the data center may be working harder (e.g., generating more kW) than other racks 115. So the required cooling power necessary at any particular location in the data center may vary over time. Approach control may, therefore, provide for the allocation of cooling fluid supply 132 automatically to "follow" the cooling load even though there may be no direct measurement of either power (e.g., kW) or flow rate (e.g., GPM) but rather, temperature measurements.

In some implementations, the approach control may be substantially static (e.g., approach temperature set point may not vary over time). For example, a static approach control may apply a single, fixed value for the approach temperature set point to all (or most) cooling units 116 in the data center. This may enable the allocation of cooling fluid (e.g., from a central plant or other cooling facility) to follow the cooling load based solely on information available locally at each cooling unit 116 (e.g., leaving air temperature and entering cooling fluid temperature). This mode may allow the temperature on the data center floor to, for example, follow the seasons in accordance with weather impact on cooling plant capacity (e.g., by maximizing free cooling opportunities).

In some implementations, the approach control may be dynamic (e.g., approach temperature set point for one or more cooling units 116 may vary over time). For example, a dynamic approach control may allow for variance of a desired approach control set point spatially and temporally. The result may be that all (or most) of the available capacity of cooling fluid from a central cooling plant (e.g., a chiller plant, free cooling facility, and/or both) can be more optimally deployed. By dynamically varying the approach temperature set point in response to such factors as, for example, the types of electronic devices (e.g., servers, processors, memory components, etc.) deployed at various locations on the data center floor; the types of services executed by such devices (e.g., web searching, electronic mail, and other web based services); an actual aggregate heat load on the data center floor; an actual cooling system capacity under current weather conditions, data center air temperatures (e.g., for airflows 118, 124, 26, and/or 128) can be moderated. Further, by dynamically varying the approach temperature, oversubscription (e.g., design of a cooling system with more cooling fluid available than used) of the cooling fluid supply 132 may be diminished.

In some implementations, implementation of a dynamic approach control scheme may utilize information that is not local to the particular cooling units 116. For example, in some implementations of dynamic approach control, information such as, for example, server deployments, aggregate server power draw, aggregate cooling plant capacities, weather values, and weather predictions in order to select and update an optimum approach set point for each individual cooling unit 116, a group of particular cooling units 116, and/or all of the cooling units 116. Further, while each cooling unit 116 can implement the static approach control locally (e.g., at the individual cooling unit 116), dynamic approach control may be implemented as a cloud based service.

Figure 2B:
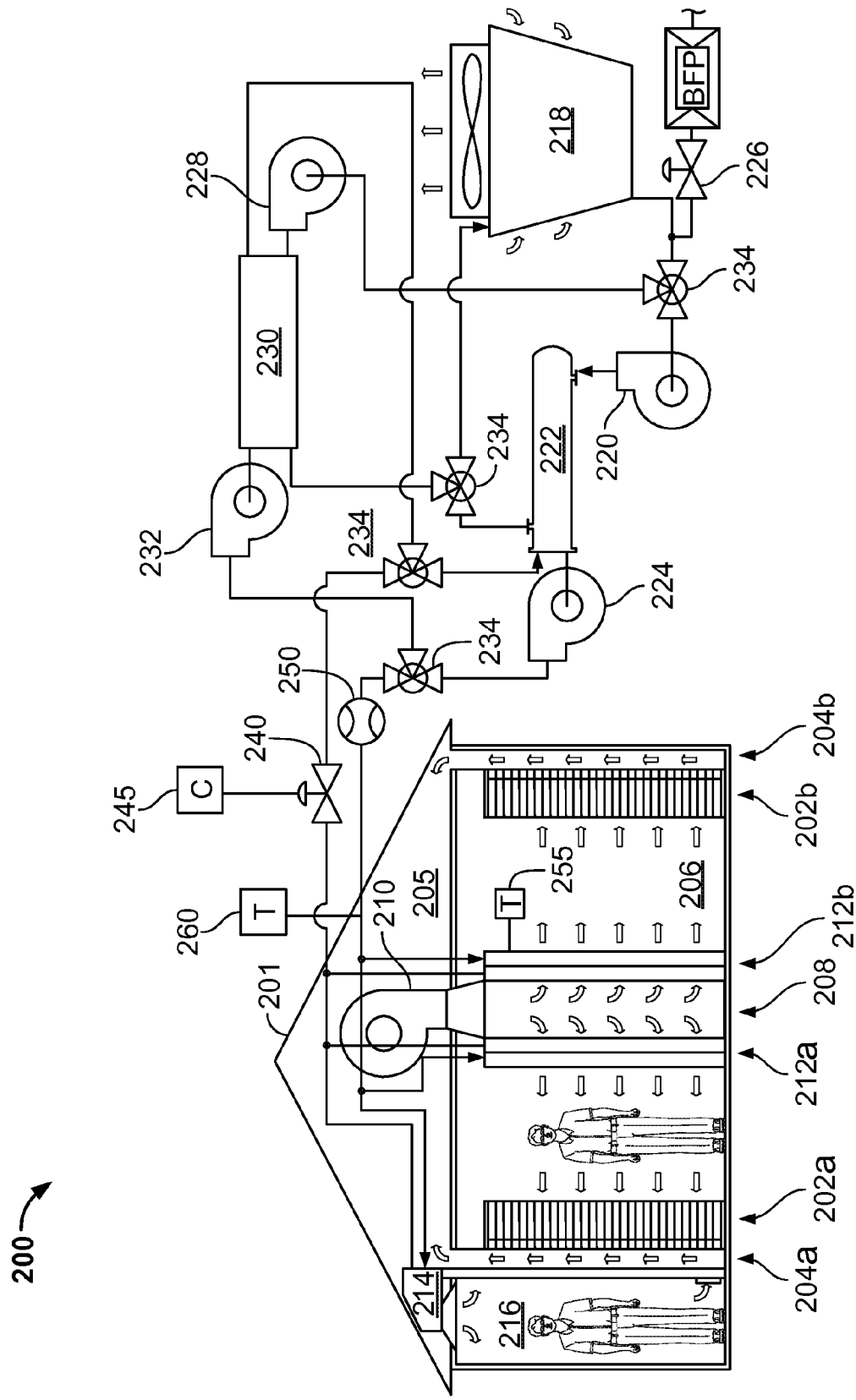
FIG. 2B illustrates a schematic diagram showing a system for cooling a computer data center.

FIG. 2B illustrates a schematic diagram showing a system 200 for cooling a computer data center 201, which as shown, is a building that houses a large number of computers or similar heat-generating electronic components. In some aspects, the system 200 may also include system 1 as described above, in order to, for example, control one or more components, including the data center cooling apparatus (e.g., chiller 230, fan 210, valve 240, and otherwise). In some implementations, the system 200 may implement static approach control and/or dynamic approach control to, for example, control an amount of cooling fluid circulated to cooling modules (such as cooling coils 212a and 212b). A workspace 206 is defined around the computers, which are arranged in a number of parallel rows and mounted in vertical racks, such as racks 202a, 202b. The racks may include pairs of vertical rails to which are attached paired mounting brackets (not shown). Trays containing computers, such as standard circuit boards in the form of motherboards, may be placed on the mounting brackets.

In one example, the mounting brackets may be angled rails welded or otherwise adhered to vertical rails in the frame of a rack, and trays may include motherboards that are slid into place on top of the brackets, similar to the manner in which food trays are slid onto storage racks in a cafeteria, or bread trays are slid into bread racks. The trays may be spaced closely together to maximize the number of trays in a data center, but sufficiently far apart to contain all the components on the trays and to permit air circulation between the trays.

Other arrangements may also be used. For example, trays may be mounted vertically in groups, such as in the form of computer blades. The trays may simply rest in a rack and be electrically connected after they are slid into place, or they may be provided with mechanisms, such as electrical traces along one edge, that create electrical and data connections when they are slid into place.

Air may circulate from workspace 206 across the trays and into warm-air plenums 204a, 204b behind the trays. The air may be drawn into the trays by fans mounted at the back of the trays (not shown). The fans may be programmed or otherwise configured to maintain a set exhaust temperature for the air into the warm air plenum, and may also be programmed or otherwise configured to maintain a particular temperature rise across the trays. Where the temperature of the air in the work space 206 is known, controlling the exhaust temperature also indirectly controls the temperature rise. The work space 206 may, in certain circumstances, be referenced as a "cold aisle," and the plenums 204a, 204b as "warm aisles."

The temperature rise can be large. For example, the work space 206 temperature may be about 77° F. (25° C.) and the exhaust temperature into the warm-air plenums 204a, 204b may be set to 113° F. (45° C.), for a 36° F. (20° C.)) rise in temperature. The exhaust temperature may also be as much as 212° F. (100° C.) where the heat generating equipment can operate at such elevated temperature. For example, the temperature of the air exiting the equipment and entering the warm-air plenum may be 118.4, 122, 129.2, 136.4, 143.6, 150.8, 158, 165, 172.4, 179.6, 186.8, 194, 201, or 208.4° F. (48, 50, 54, 58, 62, 66, 70, 74, 78, 82, 86, 90, 94, or 98° C.). Such a high exhaust temperature generally runs contrary to teachings that cooling of heat-generating electronic equipment is best conducted by washing the equipment with large amounts of fast-moving, cool air. Such a cool-air approach does cool the equipment, but it also uses lots of energy.

Cooling of particular electronic equipment, such as microprocessors, may be improved even where the flow of air across the trays is slow, by attaching impingement fans to the tops of the microprocessors or other particularly warm components, or by providing heat pipes and related heat exchangers for such components.

The heated air may be routed upward into a ceiling area, or attic 205, or into a raised floor or basement, or other appropriate space, and may be gathered there by air handling units that include, for example, fan 210, which may include, for example, one or more centrifugal fans appropriately sized for the task. The fan 210 may then deliver the air back into a plenum 208 located adjacent to the workspace 206. The plenum 208 may be simply a bay-sized area in the middle of a row of racks, that has been left empty of racks, and that has been isolated from any warm-air plenums on either side of it, and from cold-air work space 206 on its other sides. Alternatively, air may be cooled by coils defining a border of warm-air plenums 204a, 204b and expelled directly into workspace 206, such as at the tops of warm-air plenums 204a, 204b.

Cooling coils 212a, 212b may be located on opposed sides of the plenum approximately flush with the fronts of the racks. (The racks in the same row as the plenum 208, coming in and out of the page in the figure, are not shown.) The coils may have a large surface area and be very thin so as to present a low pressure drop to the system 200. In this way, slower, smaller, and quieter fans may be used to drive air through the system. Protective structures such as louvers or wire mesh may be placed in front of the coils 212a, 212b to prevent them from being damaged.

In operation, fan 210 pushes air down into plenum 208, causing increased pressure in plenum 208 to push air out through cooling coils 212a, 212b. As the air passes through the coils 212a, 212b, its heat is transferred into the water in the coils 212a, 212b, and the air is cooled.

The speed of the fan 210 and/or the flow rate or temperature of cooling water flowing in the cooling coils 212a, 212b may be controlled in response to measured values. For example, the pumps driving the cooling liquid may be variable speed pumps that are controlled to maintain a particular temperature in work space 206. Such control mechanisms may be used to maintain a constant temperature in workspace 206 or plenums 204a, 204b and attic 205.

The workspace 206 air may then be drawn into racks 202a, 202b such as by fans mounted on the many trays that are mounted in racks 202a, 202b. This air may be heated as it passes over the trays and through power supplies running the computers on the trays, and may then enter the warm-air plenums 204a, 204b. Each tray may have its own power supply and fan, with the power supply at the back edge of the tray, and the fan attached to the back of the power supply. All of the fans may be configured or programmed to deliver air at a single common temperature, such as at a set 113° F. (45° C.). The process may then be continuously readjusted as fan 210 captures and circulates the warm air.

Additional items may also be cooled using system 200. For example, room 216 is provided with a self-contained fan coil unit 214 which contains a fan and a cooling coil. The unit 214 may operate, for example, in response to a thermostat provided in room 216. Room 216 may be, for example, an office or other workspace ancillary to the main portions of the data center 201.

In addition, supplemental cooling may also be provided to room 216 if necessary. For example, a standard roof-top or similar air-conditioning unit (not shown) may be installed to provide particular cooling needs on a spot basis. As one example, system 200 may be designed to deliver 78° F. (25.56° C.) supply air to work space 206, and workers may prefer to have an office in room 216 that is cooler. Thus, a dedicated air-conditioning unit may be provided for the office. This unit may be operated relatively efficiently, however, where its coverage is limited to a relatively small area of a building or a relatively small part of the heat load from a building. Also, cooling units, such as chillers, may provide for supplemental cooling, though their size may be reduced substantially compared to if they were used to provide substantial cooling for the system 200.

Fresh air may be provided to the workspace 206 by various mechanisms. For example, a supplemental air-conditioning unit (not shown), such as a standard roof-top unit may be provided to supply necessary exchanges of outside air. Also, such a unit may serve to dehumidify the workspace 206 for the limited latent loads in the system 200, such as human perspiration. Alternatively, louvers may be provided from the outside environment to the system 200, such as powered louvers to connect to the warm air plenum 204b. System 200 may be controlled to draw air through the plenums when environmental (outside) ambient humidity and temperature are sufficiently low to permit cooling with outside air. Such louvers may also be ducted to fan 210, and warm air in plenums 204a, 204b may simply be exhausted to atmosphere, so that the outside air does not mix with, and get diluted by, the warm air from the computers. Appropriate filtration may also be provided in the system, particularly where outside air is used.

Also, the workspace 206 may include heat loads other than the trays, such as from people in the space and lighting. Where the volume of air passing through the various racks is very high and picks up a very large thermal load from multiple computers, the small additional load from other sources may be negligible, apart from perhaps a small latent heat load caused by workers, which may be removed by a smaller auxiliary air conditioning unit as described above.

Cooling water may be provided from a cooling water circuit powered by pump 224. The cooling water circuit may be formed as a direct-return, or indirect-return, circuit, and may generally be a closed-loop system. Pump 224 may take any appropriate form, such as a standard centrifugal pump. Heat exchanger 222 may remove heat from the cooling water in the circuit. Heat exchanger 222 may take any appropriate form, such as a plate-and-frame heat exchanger or a shell-and-tube heat exchanger.

Heat may be passed from the cooling water circuit to a condenser water circuit that includes heat exchanger 222, pump 220, and cooling tower 218. Pump 220 may also take any appropriate form, such as a centrifugal pump. Cooling tower 218 may be, for example, one or more forced draft towers or induced draft towers. The cooling tower 218 may be considered a free cooling source, because it requires power only for movement of the water in the system and in some implementations the powering of a fan to cause evaporation; it does not require operation of a compressor in a chiller or similar structure.

The cooling tower 218 may take a variety of forms, including as a hybrid cooling tower. Such a tower may combine both the evaporative cooling structures of a cooling tower with a water-to-water heat exchanger. As a result, such a tower may be fit in a smaller face and be operated more modularly than a standard cooling tower with separate heat exchanger. Additional advantage may be that hybrid towers may be run dry, as discussed above. In addition, hybrid towers may also better avoid the creation of water plumes that may be viewed negatively by neighbors of a facility.

As shown, the fluid circuits may create an indirect waterside economizer arrangement. This arrangement may be relatively energy efficient, in that the only energy needed to power it is the energy for operating several pumps and fans. In addition, this system may be relatively inexpensive to implement, because pumps, fans, cooling towers, and heat exchangers are relatively technologically simple structures that are widely available in many forms. In addition, because the structures are relatively simple, repairs and maintenance may be less expensive and easier to complete. Such repairs may be possible without the need for technicians with highly specialized knowledge.

Alternatively, direct free cooling may be employed, such as by eliminating heat exchanger 222, and routing cooling tower water (condenser water) directly to cooling coils 212a, 212b (not shown). Such an implementation may be more efficient, as it removes one heat exchanging step. However, such an implementation also causes water from the cooling tower 218 to be introduced into what would otherwise be a closed system. As a result, the system in such an implementation may be filled with water that may contain bacteria, algae, and atmospheric contaminants, and may also be filled with other contaminants in the water. A hybrid tower, as discussed above, may provide similar benefits without the same detriments.

Control valve 226 is provided in the condenser water circuit to supply make-up water to the circuit. Make-up water may generally be needed because cooling tower 218 operates by evaporating large amounts of water from the circuit. The control valve 226 may be tied to a water level sensor in cooling tower 218, or to a basin shared by multiple cooling towers. When the water falls below a predetermined level, control valve 226 may be caused to open and supply additional makeup water to the circuit. A back-flow preventer (BFP) may also be provided in the make-up water line to prevent flow of water back from cooling tower 218 to a main water system, which may cause contamination of such a water system.

Optionally, a separate chiller circuit may be provided. Operation of system 200 may switch partially or entirely to this circuit during times of extreme atmospheric ambient (i.e., hot and humid) conditions or times of high heat load in the data center 201. Controlled mixing valves 234 are provided for electronically switching to the chiller circuit, or for blending cooling from the chiller circuit with cooling from the condenser circuit. Pump 228 may supply tower water to chiller 230, and pump 232 may supply chilled water, or cooling water, from chiller 230 to the remainder of system 200. Chiller 230 may take any appropriate form, such as a centrifugal, reciprocating, or screw chiller, or an absorption chiller.

The chiller circuit may be controlled to provide various appropriate temperatures for cooling water. In some implementations, the chilled water may be supplied exclusively to a cooling coil, while in others, the chilled water may be mixed, or blended, with water from heat exchanger 222, with common return water from a cooling coil to both structures. The chilled water may be supplied from chiller 230 at temperatures elevated from typical chilled water temperatures. For example, the chilled water may be supplied at temperatures of 55° F. (13° C.) to 65 to 70° F. (18 to 21° C.) or higher. The water may then be returned at temperatures like those discussed below, such as 59 to 176° F. (15 to 80° C.). In this approach that uses sources in addition to, or as an alternative to, free cooling, increases in the supply temperature of the chilled water can also result in substantial efficiency improvements for the system 200.

Pumps 220, 224, 228, 232, may be provided with variable speed drives. Such drives may be electronically controlled by a central control system to change the amount of water pumped by each pump in response to changing set points or changing conditions in the system 200. For example, pump 224 may be controlled to maintain a particular temperature in workspace 206, such as in response to signals from a thermostat or other sensor in workspace 206.

In operation, system 200 may respond to signals from various sensors placed in the system 200. The sensors may include, for example, thermostats, humidistats, flowmeters, and other similar sensors. In one implementation, one or more thermostats may be provided in warm air plenums 204a, 204b, and one or more thermostats may be placed in workspace 206. In addition, air pressure sensors may be located in workspace 206, and in warm air plenums 204a, 204b. The thermostats may be used to control the speed of associated pumps, so that if temperature begins to rise, the pumps turn faster to provide additional cooling waters. Thermostats may also be used to control the speed of various items such as fan 210 to maintain a set pressure differential between two spaces, such as attic 205 and workspace 206, and to thereby maintain a consistent airflow rate. Where mechanisms for increasing cooling, such as speeding the operation of pumps, are no longer capable of keeping up with increasing loads, a control system may activate chiller 230 and associated pumps 228, 232, and may modulate control valves 234 accordingly to provide additional cooling.

Various values for temperature of the fluids in system 200 may be used in the operation of system 200. In one exemplary implementation, the temperature set point in warm air plenums 204a, 204b may be selected to be at or near a maximum exit temperature for trays in racks 202a, 202b. This maximum temperature may be selected, for example, to be a known failure temperature or a maximum specified operating temperature for components in the trays, or may be a specified amount below such a known failure or specified operating temperature. In certain implementations, a temperature of 45° C. may be selected. In other implementations, temperatures of 25° C. to 125° C. may be selected. Higher temperatures may be particularly appropriate where alternative materials are used in the components of the computers in the data center, such as high temperature gate oxides and the like.

In one implementation, supply temperatures for cooling water may be 68° F. (20° C.), while return temperatures may be 104° F. (40° C.). In other implementations, temperatures of 50° F. to 84.20° F. or 104° F. (10° C. to 29° C. or 40° C.) may be selected for supply water, and 59° F. to 176° F. (15° C. to 80° C.) for return water. Chilled water temperatures may be produced at much lower levels according to the specifications for the particular selected chiller. Cooling tower water supply temperatures may be generally slightly above the wet bulb temperature under ambient atmospheric conditions, while cooling tower return water temperatures will depend on the operation of the system 200.

Using these parameters and the parameters discussed above for entering and exiting air, relatively narrow approach temperatures may be achieved with the system 200. The approach temperature, in this example, is the difference in temperature between the air leaving a coil and the water entering a coil. The approach temperature will always be positive because the water entering the coil is the coldest water, and will start warming up as it travels through the coil. As a result, the water may be appreciably warmer by the time it exits the coil, and as a result, air passing through the coil near the water's exit point will be warmer than air passing through the coil at the water's entrance point. Because even the most-cooled exiting air, at the cooling water's entrance point, will be warmer than the entering water, the overall exiting air temperature will need to be at least somewhat warmer than the entering cooling water temperature.

In certain implementations, the entering water temperature may be 64° F. (18° C.) and the exiting air temperature 77° F. (25° C.), as noted above, for an approach temperature of 12.6° F. (7° C.). In other implementations, wider or narrower approach temperature may be selected based on economic considerations for an overall facility.

With a close approach temperature, the temperature of the cooled air exiting the coil will closely track the temperature of the cooling water entering the coil. As a result, the air temperature can be maintained, generally regardless of load, by maintaining a constant water temperature. In an evaporative cooling mode, a constant water temperature may be maintained as the wet bulb temperature stays constant (or changes very slowly), and by blending warmer return water with supply water as the wet bulb temperature falls. As such, active control of the cooling air temperature can be avoided in certain situations, and control may occur simply on the cooling water return and supply temperatures. The air temperature may also be used as a check on the water temperature, where the water temperature is the relevant control parameter.

As illustrated, the system 200 also includes a control valve 240 and a controller 245 operable to modulate the valve 240 in response to or to maintain, for example, an approach temperature set point of the cooling coils 212a and 212b. For example, an airflow temperature sensor 255 may be positioned at a leaving face of one or both of the cooling coils 212a and 212b. The temperature sensor 255 may thus measure a leaving air temperature from the cooling coils 212a and/or 212b. A temperature sensor 260 may also be positioned in a fluid conduit that circulates the cooling water to the cooling coils 212a and 212b (as well as fan coil 214).

Controller 245 (which, in some aspects, may be part of or all of the controller 3 or part of the control engine 10a), as illustrated, may receive temperature information from one or both of the temperature sensors 255 and 260. In some implementations, the controller 245 may be a main controller (i.e., processor-based electronic device or other electronic controller) of the cooling system of the data center, which is communicably coupled to each control valve (such as control valve 240) of the data center and/or individual controllers associated with the control valves. For example, the main controller may be a master controller communicably coupled to slave controllers at the respective control valves. In some implementations, the controller 245 may be a Proportional-Integral-Derivative (PID) controller. Alternatively, other control schemes, such as PI or otherwise, may be utilized. As another example, the control scheme may be implemented by a controller utilizing a state space scheme (e.g., a time-domain control scheme) representing a mathematical model of a physical system as a set of input, output and state variables related by first-order differential equations. In some example implementations, the controller 245 (or other controllers described herein) may be a programmable logic controller (PLC), a computing device (e.g., desktop, laptop, tablet, mobile computing device, server or otherwise), or other form of controller. In cases in which a controller may control a fan motor, for instance, the controller may be a circuit breaker or fused disconnect (e.g., for on/off control), a two-speed fan controller or rheostat, or a variable frequency drive.

In operation, the controller 245 may receive the temperature information and determine an actual approach temperature. The controller 245 may then compare the actual approach temperature set point against a predetermined approach temperature set point. Based on a variance between the actual approach temperature and the approach temperature set point, the controller 245 may modulate the control valve 240 (and/or other control valves fluidly coupled to cooling modules such as the cooling coils 212a and 212b and fan coil 214) to restrict or allow cooling water flow. For instance, in the illustrated implementation, modulation of the control valve 240 may restrict or allow flow of the cooling water from or to the cooling coils 212a and 212b as well as the fan coil 214. After modulation, if required, the controller 245 may receive additional temperature information and further modulate the control valve 240 (e.g., implement a feedback loop control).

Figure 3A:
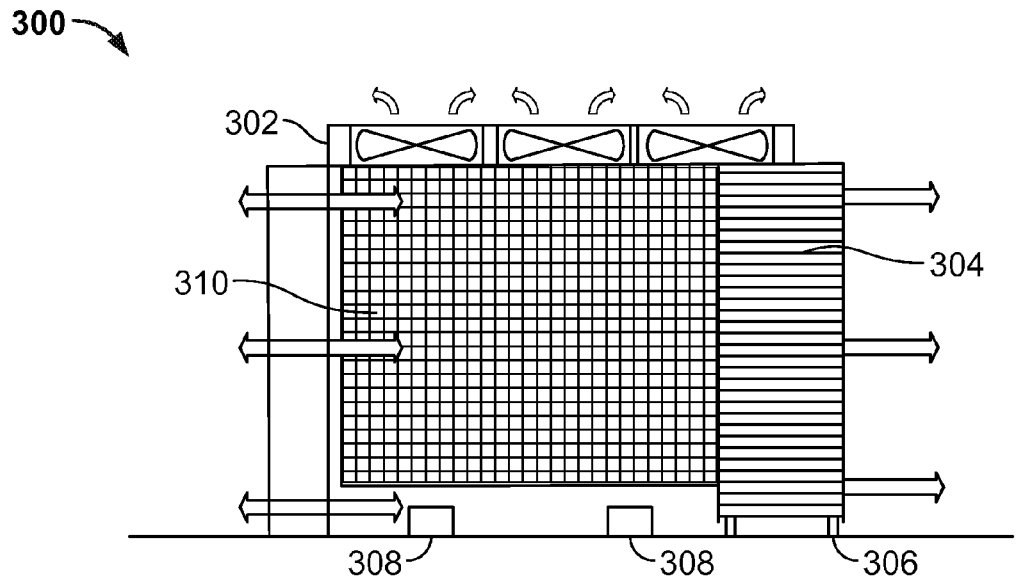
FIGS. 3A-3B show views of an example data center cooling apparatus with a single computer rack and a pair of back-to-back computer racks, respectively.
Figure 3B:
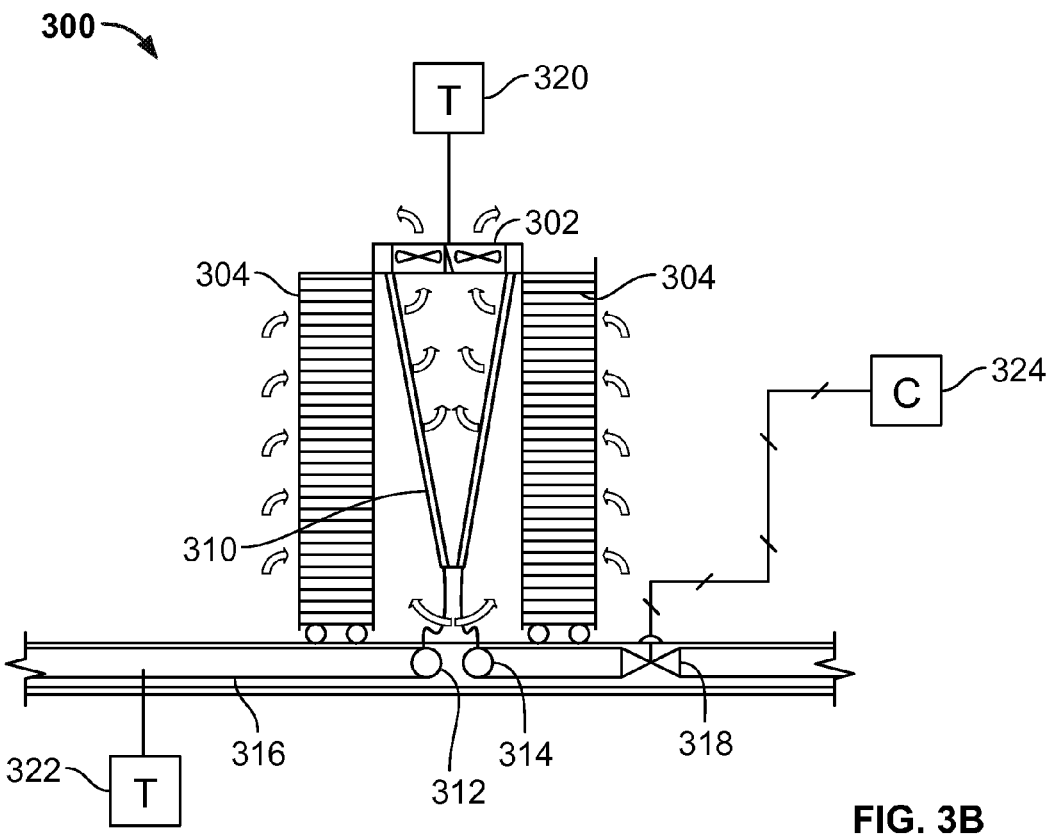

FIGS. 3A-3B show views of an example data center cooling apparatus with a single computer rack 304 and a pair of back-to-back computer racks 304, respectively. Turning to FIG. 3A, in general, this figure shows a computer rack 304 positioned in front of a modular cooling apparatus 302, to form an air circulation system 300. In this example, the rack 304 is a single bay rather than a three-bay assembly as in the earlier figures. The other two bays have been left out to provide a clearer view of the apparatus 302 relative to the rack 304. FIG. 3A shows a side view of the same apparatus, with another computer rack on a back side of the apparatus 302, to form a back-to-back configuration.

The rack 304 is provided with caster wheels 306 (or another type of roller) so that it may be easily manipulated by a technician in a data center, and positioned in front of the apparatus 302. Locking structures or other joining mechanisms may hold the rack 304 in place and may, in appropriate circumstances, seal the rack to the apparatus 302 to prevent air leaks. However, where fans in the apparatus 302 are controlled to maintain a nearly zero pressure differential between the workspace and the area at the front of the apparatus 302, there is less need for such sealing because of the lack of a pressure differential between a warm air capture plenum in the apparatus 302 and the workspace.

The face of apparatus 302, near its left side, is visible in FIG. 3A because no racks have yet been positioned there. This view shows a front surface of a coil 310, which may be a surface like one sees when looking at the front of a car radiator. In this example, the surface area may be relatively large, such as on the order of 6 feet wide by 5 feet high. The coils may be sized in an appropriate manner to provide cooling to offset the heat generated by computers in a rack 304 and in other racks corresponding to apparatus 302. Also, a space may be provided beneath the coils to prevent air to pass from one side of the apparatus 302 to the other. As shown by the flow arrows, air may also be allowed to pass in and out of ends of the apparatus 302.

In one example, apparatus 302 may support six or more bays in a pair of racks, as may be seen in FIG. 4 and the accompanying description. Each bay may, in turn, host on the order of 20 to 40 trays, which may each include one or more microprocessors and associated electronics, and a power supply. Certain of the trays may be dedicated to processing, while other trays may be dedicated wholly or in part to storage or networking, and may host a number of hard drives or other storage mechanisms, which generally generate less heat than do microprocessors.

FIG. 3A also shows lifting structures in the form of skid channels 308 under the apparatus 302. As explained above, such structures may provide for convenient transport, movement, positioning, and repositioning of the apparatus 302 by standard processes and with standard equipment. Other lifting structures such as overhead hooks may also be employed. The ends of apparatus 302 are also shown as being open, as described above and as indicated by air flow arrows pointing left and right in FIG. 3A along the length of apparatus 302, to permit for apparatus-to-apparatus flow of warm air.

As shown in FIG. 3B, a back-to-back arrangement is provided, and a V-shaped coil 310 arrangement is also provided. From this angle, a raised floor is shown as defining a sub-space 312 below the data center. The sub-space 312 may hold, for example, coolant (e.g., water or refrigerant) supply piping 316 and return piping 314. Connections tapping off of such piping may extend up through the floor and into the apparatus 302.

In another arrangement, the raised floor may be eliminated, and the piping 316 and 314 may run lengthwise inside the apparatus 302. Such piping may be moved into place after a row or part of a row of such apparatuses are moved into place (e.g., by sliding it down the row and into the housings). Alternatively, each apparatus may have its own length of supply piping and a length of return piping that each terminate near an end of the apparatus housing. Piping segments for adjacent apparatuses may then be connected using short flexible connectors. Or where such apparatuses are separated by a space, the connection may be made by a length of standard piping inserted between the adjacent apparatuses (perhaps with flexible connections at each end).

The illustrated air circulation system 300 also includes a temperature sensor 320 positioned to measure a leaving air temperature of the cooling apparatus 302 (e.g., from the fans of the apparatus 302). Another temperature sensor 322 is positioned in the supply piping 316 to measure a temperature of a cooling fluid circulated to cooling coils 310. Alternatively, the temperature sensor 322 may be positioned elsewhere in the system 300 to measure the temperature of the cooling fluid circulated to the cooling coils 310.

The illustrated circulation system 300 also includes a control valve 318 positioned to restrict flow of the cooling fluid through the cooling coils 310. As illustrated, the control valve 318 is positioned in line with the return piping 314. Alternatively, the control valve 318 may be positioned in the supply piping 316 or at another location in fluid communication with the cooling coils 310.

The illustrated circulation system 300 also includes a controller 324 in communication with the control valve 318.

In some implementations, the controller 324 may modulate the control valve 318 according to an approach temperature set point (e.g., a predetermined value defined by a difference between a leaving air temperature of the cooling apparatus 302 and an entering fluid temperature to the cooling coils 310). In some implementations, as described above, the controller 324 may adjust the approach temperature set point according to a variety of factors. Further, in some implementations, the controller 324 may be an individual (e.g., slave) controller that receives commands (e.g., approach temperature set point) from a master or main controller of the air circulation system 300 and/or data center.

FIGS. 4A-4C illustrate example implementations of a portion of a data center cooling apparatus positioned adjacent a pair of racks. In some aspects, the portion of the data center shown in these figures may also include system 1 as described above, in order to, for example, control one or more components, including cooling apparatus described below. For example, FIG. 4A shows a side view 430 of a pair of racks having stand-offs at their back edges. In general, this figure shows that the racks may extend farther backward than do the motherboards and other associated items in the rack that block air from flowing up and down. In this manner, a space may be maintained or provided for behind the exhaust point for each tray, so that air may move relatively freely from area to area behind the trays, even if the racks are pushed flat up against a coil having a vertical face that effectively seals against the back surface of the rack. As a result, hot exiting air may spread out some before passing through the coil so that more of the surface area of the coil is used for cooling. Also, air may move up and down or side-to-side to provide better diversity in a system, in case certain areas are presenting a higher heat load than are others, or certain areas have less capacity (such as if coils in those areas are defective or broken) than do others. Also, by permitting spreading of the air, the coil 437 may use much more of its cooling surface area, and not just the area that is directly targeted by fans.

As shown in the example from the figure, a rack 434 holding a number of removable trays is positioned back-to-back with another rack. Vertical coil 437 is positioned against the back edge of the rack 434. Because the rack 434 is deeper than are the trays inserted into the rack, a space 436 is defined up and down the rack 434 behind the trays. For example, the back edge of the trays may hold a number of circulation fans and/or power supplies through which warmed air is ejected from the trays. Air is drawn by fan 432 through coil 437 into cool air plenum 438. In this example, the coil 437 is shown as a vertical coil covering part of the back of the rack, and pressed flat against the back of the rack; other arrangements for the coil may also be used, however. For example, the coil may be placed above the top levels of the racks and the racks may be pressed back-to-back against each other, with lateral and up-and-down airflow entirely in the stand-off areas. In one example, the coils may be arranged as an inverted V, immediately over the warm air plenum that is formed between the opposed back edges of the trays in the racks.

The separation, or stand-off, may be implemented in a variety of manners. For example, the frame of the rack may be arranged to be deeper than are the various trays placed in the rack; the sides of the frames may also be left open so as to permit lateral air flow even when frames are pressed back-to-back against each other. Likewise, the frame may have substantially the same depth as the trays, and extensions may be affixed to the rack and stick out backward from the rack to act as a standoff. Other mechanisms for ensuring some spacing or a particular extent of spacing, may also be used.

FIG. 4B shows a side view 440 of a pair of racks having slanted trays. One example is tray 444, which is arranged as part of an array of trays in a vertical stack, similar to the other examples discussed above. Also, the tray 444 has a power supply and circulation fan at its back edge. In this example, however, the tray 444, like the other trays, is substantially higher at its back end than at its front end. In operation, circulating air is thus drawn in the front of the rack holding tray 444 and other trays, and into warm air plenum 446 behind the trays. The air is then drawn through cooling coils by fan 442 and into cool air plenum 448, where it is then circulated back into the workspace. The area at the front of a rack above the highest tray may be covered by a blanking panel or other structure to prevent air flow at such a location.

The fans and/or power supply associated with tray 444 may be mounted with the tray 444 or separately. Thus, for example, the axis of the fan may be co-axial with the direction of airflow up the tray 444 (i.e., the fan may be slanted with the tray 444), or the fan may be positioned horizontally, vertically, or in another orientation that differs from the angle of the tray 444.

Because the air is warmed by electronic components on the tray 444 as it passes over the tray 444, it tends to rise naturally from the front of the tray 444 toward the back. Such natural motion may create or supplement the air circulation across the tray 444. In certain implementations, mechanical circulating systems such as fans may be removed from the back edges of the trays so that the back edges are partially or wholly open, and the natural convection of the warmed air may push the air out the back of the trays even in the absence of substantial mechanical assistance. Such natural circulation may increase air circulation during normal operation and may also permit certain circulation so as to permit limited operation even when mechanical systems fails, or to act as sufficient total circulation for trays carrying components having a low heat load. Also, although mounting of the racks at a substantial angle, such as more than 20 degrees, more than 30 degrees, or more than 40 degrees from the horizontal, can create potentially wasteful dead space (see the open triangular area above rack 444), such space is not wasted in this context because the top trays can take up space above a worker's reach because the worker need only reach the front, lowest part of the top tray for maintenance purposes.

FIG. 4C shows a side view 450 of a pair of racks of computers having coils mounted above the racks. In general, this implementation differs from others described in this document in that the cooling coil here is mounted above the racks rather than below or behind them. Placement of cooling coils above a rack may typically be discouraged because such an arrangement places water-filled components above electrical devices that could short out if hit by water. However, in this implementation, shields 454 are provided below the coils 452 to catch any leaking water and to channel it away from the computers 458, such as laterally (as viewing the racks from their front, open edges) and then against an end wall of a row of racks, to a downpipe, or to another fluid collection mechanism.

The shields 454 may be sloped slightly from the horizontal from front to back to direct fluid back so that it is no longer over any trays, and from side-to-side to direct fluid to one of their sides, such as a side that is not over the computers 458, and may also be provided with a deepened channel that can carry additional fluid without flowing over an edge of the shields 454. For example, where the shields are made from sheet metal or a similar material, gutters may be formed along an edge by crimping the metal along a line.

The shields 454 may be arranged and configured in a variety of manners so as to lessen the chance that water may splash or otherwise reach the computers 458. For example, multiple angles may be crimped into the shield 454 so as to lessen upward splashing when water hits the shield 454. Also, the top surface of the shield may be perforated, or a screen, foam pad, or similar structure may be laid over the shield 454 to lessen any splashing. Also, other portions of the racks may be likewise configured to prevent dripping or splashing. For example, frame members of a rack may have their edges curled or crimped backward so as to catch water that would otherwise drip off the edges and perhaps onto a motherboard. Such frame members may then have drain holes provided at appropriate locations along their lengths so as to permit caught water to drain downward.

Placement of coils over the level of racks may provide a number of benefits. For example, by moving coils out of the space between racks, the racks may generally be moved closer together because the space for vertical airflow in the warm air plenum is substantially unimpeded. For example, the racks of FIG. 4C are shown as touching back-to-back (with a stand-off between the back of each motherboard and the back of each rack, to permit for up and down airflow), while the racks in the other figures show a greater spacing. The particular reduction in spacing will, of course, depend on the particular levels of airflow needed to cool the system. As a result, additional floor space may be recovered in a facility with a coil-on-top arrangement.

In addition, placing coils above rather than below the rack may allow additional computers to be installed up and down a rack and still be within acceptable reach of a technician. For instance, if a cooling module is two feet off the ground, and computers are only installed in line with the coil portion, removing the module from the bottom of a rack may enable a system to have two additional feet of computers in every rack, and to thus use several additional computers in every rack. Generally, coils do not fail as often as computers do, so having coils in an out-of-reach area is less troublesome than having computers in such an area. Moreover, the coils in this arrangement may be mounted to long-term infrastructure, such as scaffolding that sits behind or between particular racks. As a result, the racks may be readily moved into position.

In a similar arrangement a wall may be supplied at a back wall of the warm-air plenum for each opposed rack, and/or the coil and fan arrangement may be integrated to move with the rack. In such an arrangement, the computer rack and the cooling and ventilation system would be part of a single assembly. The back panel may be used to create a single warm air plenum for a rack or adjacent racks (with airflow permitted laterally between adjacent racks) in a single row (e.g., for use when a row of racks backs up to a wall) or the back panel may be omitted to create a common warm air plenum for back-to-back rows of racks.

Also, the coil may be placed on the top of the rack or the bottom of the rack in such an integrated implementation. When placed on top, the coil may be positioned horizontally, with air flowing through it vertically, and the fans may be placed on top of the coil blowing up. When placed on the bottom, a right angle plenum may be used to route air under the rack and through a vertically mounted coil (having horizontal airflow) and fan.

FIG. 5 shows a plan view of two rows 502 and 506, respectively, in a computer data center 500 with cooling modules arranged between racks situated in the rows. In some implementations, the data center 500 may implement static approach control and/or dynamic approach control to, for example, control an amount of cooling fluid circulated to cooling modules. In general, this figure illustrates certain levels of density and flexibility that may be achieved with structures like those discussed above. Each of the rows 502, 506 is made up of a row of cooling modules 512 sandwiched by two rows of computing racks 511, 513. In some implementations (not shown), a row may also be provided with a single row of computer racks, such as by pushing the cooling modules up against a wall of a data center, providing blanking panels all across one side of a cooling module row, or by providing cooling modules that only have openings on one side.

This figure also shows a component—network device 510—that was not shown in prior figures. Network device 510 may be, for example, a network switch into which each of the trays in a rack plugs, and which then in turn communicates with a central network system. For example, the network device may have 20 or data more ports operating at 100 Mbps or 1000 Mbps, and may have an uplink port operating at 1000 Mbps or 10 Gbps, or another appropriate network speed. The network device 510 may be mounted, for example, on top of the rack, and may slide into place under the outwardly extending portions of a fan tray. Other ancillary equipment for supporting the computer racks may also be provided in the same or a similar location, or may be provided on one of the trays in the rack itself.

Each of the rows of computer racks and rows of cooling units in each of rows 502, 506 may have a certain unit density. In particular, a certain number of such computing or cooling units may repeat over a certain length of a row such as over 100 feet. Or, expressed in another way, each of the units may repeat once every X feet in a row.

In this example, each of the rows is approximately 40 feet long. Each of the three-bay racks is approximately six feet long. And each of the cooling units is slightly longer than each of the racks. Thus, for example, if each rack were exactly six feet long and all of the racks were adjoining, the rack units would repeat every six feet. As a result, the racks could be said to have a six-foot "pitch."

As can be seen, the pitch for the cooling module rows is different in row 502 than in row 506. Row 512 in row 502 contains five cooling modules, while the corresponding row of cooling modules in row 506 contains six cooling modules. Thus, if one assumes that the total length of each row is 42 feet, then the pitch of cooling modules in row 506 would be 7 feet (42/6) and the pitch of cooling modules in row 502 would be 8.4 feet (42/5).

The pitch of the cooling modules and of the computer racks may differ (and the respective lengths of the two kinds of apparatuses may differ) because warm air is able to flow up and down rows such as row 512. Thus, for example, a bay or rack may exhaust warm air in an area in which there is no cooling module to receive it. But that warm air may be drawn laterally down the row and into an adjacent module, where it is cooled and circulated back into the work space, such as aisle 504.

With all other things being equal, row 502 would receive less cooling than would row 506. However, it is possible that row 502 needs less cooling, so that the particular number of cooling modules in each row has been calculated to match the expected cooling requirements. For example, row 502 may be outfitted with trays holding new, low-power microprocessors; row 502 may contain more storage trays (which are generally lower power than processor trays) and fewer processor trays; or row 502 may generally be assigned less computationally intensive work than is row 506.

In addition, the two rows 502, 506 may both have had an equal number of cooling modules at one time, but then an operator of the data center may have determined that row 502 did not need as many modules to operate effectively. As a result, the operator may have removed one of the modules so that it could be used elsewhere.

The particular density of cooling modules that is required may be computed by first computing the heat output of computer racks on both sides of an entire row. The amount of cooling provided by one cooling module may be known, and may be divided into the total computed heat load and rounded up to get the number of required cooling units. Those units may then be spaced along a row so as to be as equally spaced as practical, or to match the location of the heat load as closely as practical, such as where certain computer racks in the row generate more heat than do others. Also, as explained in more detail below, the row of cooling units may be aligned with rows of support columns in a facility, and the units may be spaced along the row so as to avoid hitting any columns.

Where there is space between cooling modules, a blanking panel 520 may be used to block the space so that air from the warm air capture plenum does not escape upward into the work space. The panel 520 may simply take the form of a paired set of sheet metal sheets that slide relative to each other along slots 518 in one of the sheets, and can be fixed in location by tightening a connector onto the slots.

FIG. 5 also shows a rack 524 being removed for maintenance or replacement. The rack 524 may be mounted on caster wheels so that one of technicians 522 could pull it forward into aisle 504 and then roll it away. In the figure, a blanking panel 516 has been placed over an opening left by the removal of rack 524 to prevent air from the work space from being pulled into the warm air capture plenum, or to prevent warm air from the plenum from mixing into the work space. The blanking panel 516 may be a solid panel, a flexible sheet, or may take any other appropriate form.

In one implementation, a space may be laid out with cooling units mounted side-to-side for maximum density, but half of the units may be omitted upon installation (e.g., so that there is 50% coverage). Such an arrangement may adequately match the cooling unit capacity (e.g., about four racks per unit, where the racks are approximately the same length as the cooling units and mounted back-to-back on the cooling units) to the heat load of the racks. Where higher powered racks are used, the cooling units may be moved closer to each other to adapt for the higher heat load (e.g., if rack spacing is limited by maximum cable lengths), or the racks may be spaced from each other sufficiently so that the cooling units do not need to be moved. In this way, flexibility may be achieved by altering the rack pitch or by altering the cooling unit pitch.

Figure 6A:
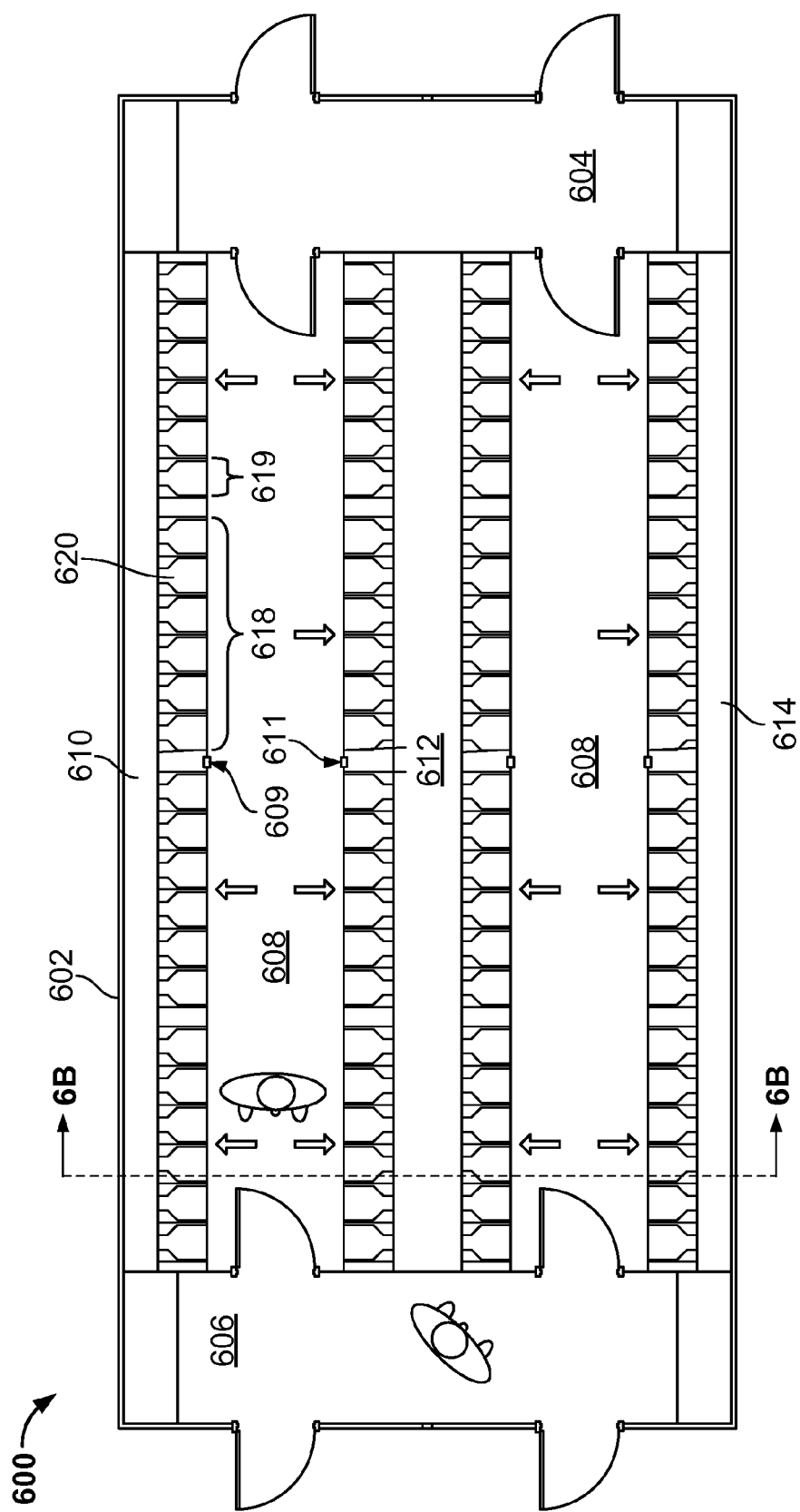

FIGS. 6A-6B show plan and sectional views, respectively, of a modular data center system. In some implementations, one of more data processing centers 600 may implement static approach control and/or dynamic approach control to, for example, control an amount of cooling fluid circulated to cooling modules. The system may include one of more data processing centers 600 in shipping containers 602. Although not shown to scale in the figure, each shipping container 602 may be approximately 40 feet along, 8 feet wide, and 9.5 feet tall (e.g., a 1AAA shipping container). In other implementations, the shipping container can have different dimensions (e.g., the shipping container can be a 1CC shipping container). Such containers may be employed as part of a rapid deployment data center.

Each container 602 includes side panels that are designed to be removed. Each container 602 also includes equipment designed to enable the container to be fully connected with an adjacent container. Such connections enable common access to the equipment in multiple attached containers, a common environment, and an enclosed environmental space.

Each container 602 may include vestibules 604, 606 at each end of the relevant container 602. When multiple containers are connected to each other, these vestibules provide access across the containers. One or more patch panels or other networking components to permit for the operation of data processing center 600 may also be located in vestibules 604, 606. In addition, vestibules 604, 606 may contain connections and controls for the shipping container. For example, cooling pipes (e.g., from heat exchangers that provide cooling water that has been cooled by water supplied from a source of cooling such as a cooling tower) may pass through the end walls of a container, and may be provided with shut-off valves in the vestibules 604, 606 to permit for simplified connection of the data center to, for example, cooling water piping. Also, switching equipment may be located in the vestibules 604, 606 to control equipment in the container 602. The vestibules 604, 606 may also include connections and controls for attaching multiple containers 602 together. As one example, the connections may enable a single external cooling water connection, while the internal cooling lines are attached together via connections accessible in vestibules 604, 606. Other utilities may be linkable in the same manner.

Central workspaces 608 may be defined down the middle of shipping containers 602 as aisles in which engineers, technicians, and other workers may move when maintaining and monitoring the data processing center 600. For example, workspaces 608 may provide room in which workers may remove trays from racks and replace them with new trays. In general, each workspace 608 is sized to permit for free movement by workers and to permit manipulation of the various components in data processing center 600, including providing space to slide trays out of their racks comfortably. When multiple containers 602 are joined, the workspaces 608 may generally be accessed from vestibules 604, 606.

A number of racks such as rack 619 may be arrayed on each side of a workspace 608. Each rack may hold several dozen trays, like tray 620, on which are mounted various computer components. The trays may simply be held into position on ledges in each rack, and may be stacked one over the other. Individual trays may be removed from a rack, or an entire rack may be moved into a workspace 608.

The racks may be arranged into a number of bays such as bay 618. In the figure, each bay includes six racks and may be approximately 8 feet wide. The container 602 includes four bays on each side of each workspace 608. Space may be provided between adjacent bays to provide access between the bays, and to provide space for mounting controls or other components associated with each bay. Various other arrangements for racks and bays may also be employed as appropriate.

Warm air plenums 610, 614 are located behind the racks and along the exterior walls of the shipping container 602. A larger joint warm air plenum 612 is formed where the two shipping containers are connected. The warm air plenums receive air that has been pulled over trays, such as tray 620, from workspace 608. The air movement may be created by fans located on the racks, in the floor, or in other locations. For example, if fans are located on the trays and each of the fans on the associated trays is controlled to exhaust air at one temperature, such as 40° C., 42.5° C., 45° C., 47.5° C., 50° C., 52.5° C., 55° C., or 57.5° C., the air in plenums 610, 612, 614 will generally be a single temperature or almost a single temperature. As a result, there may be little need for blending or mixing of air in warm air plenums 610, 612, 614. Alternatively, if fans in the floor are used, there will be a greater degree temperature variation from air flowing over the racks, and greater degree of mingling of air in the plenums 610, 612, 614 to help maintain a consistent temperature profile.

FIG. 6B shows a sectional view of the data center from FIG. 6A. This figure more clearly shows the relationship and airflow between workspaces 608 and warm air plenums 610, 612, 614. In particular, air is drawn across trays, such as tray 620, by fans at the back of the trays 619. Although individual fans associated with single trays or a small number of trays, other arrangements of fans may also be provided. For example, larger fans or blowers, may be provided to serve more than one tray, to serve a rack or group or racks, or may be installed in the floor, in the plenum space, or other location.

Air may be drawn out of warm air plenums 610, 612, 614 by fans 622, 624, 626, 628. Fans 622, 624, 626, 628 may take various forms. In one exemplary implementation, the may be in the form of a number of squirrel cage fans. The fans may be located along the length of container 602, and below the racks, as shown in FIG. 6B. A number of fans may be associated with each fan motor, so that groups of fans may be swapped out if there is a failure of a motor or fan.

An elevated floor 630 may be provided at or near the bottom of the racks, on which workers in workspaces 608 may stand. The elevated floor 630 may be formed of a perforated material, of a grating, or of mesh material that permits air from fans 622, 624 to flow into workspaces 608. Various forms of industrial flooring and platform materials may be used to produce a suitable floor that has low pressure losses.

Fans 622, 624, 626, 628 may blow heated air from warm air plenums 610, 612, 614 through cooling coils 662, 664, 666, 668. The cooling coils may be sized using well known techniques, and may be standard coils in the form of air-to-water heat exchangers providing a low air pressure drop, such as a 0.5 inch pressure drop. Cooling water may be provided to the cooling coils at a temperature, for example, of 10, 15, or 20 degrees Celsius, and may be returned from cooling coils at a temperature of 20, 25, 30, 35, or 40 degrees Celsius. In other implementations, cooling water may be supplied at 15, 10, or 20 degrees Celsius, and may be returned at temperatures of about 25 degrees Celsius, 30 degrees Celsius, 35 degrees Celsius, 45 degrees Celsius, 50 degrees Celsius, or higher temperatures. The position of the fans 622, 624, 626, 628 and the coils 662, 664, 666, 668 may also be reversed, so as to give easier access to the fans for maintenance and replacement. In such an arrangement, the fans will draw air through the cooling coils.

The particular supply and return temperatures may be selected as a parameter or boundary condition for the system, or may be a variable that depends on other parameters of the system. Likewise, the supply or return temperature may be monitored and used as a control input for the system, or may be left to range freely as a dependent variable of other parameters in the system. For example, the temperature in workspaces 608 may be set, as may the temperature of air entering plenums 610, 612, 614. The flow rate of cooling water and/or the temperature of the cooling water may then vary based on the amount of cooling needed to maintain those set temperatures.

The particular positioning of components in shipping container 602 may be altered to meet particular needs. For example, the location of fans and cooling coils may be changed to provide for fewer changes in the direction of airflow or to grant easier access for maintenance, such as to clean or replace coils or fan motors. Appropriate techniques may also be used to lessen the noise created in workspace 608 by fans. For example, placing coils in front of the fans may help to deaden noise created by the fans. Also, selection of materials and the layout of components may be made to lessen pressure drop so as to permit for quieter operation of fans, including by permitting lower rotational speeds of the fans. The equipment may also be positioned to enable easy access to connect one container to another, and also to disconnect them later. Utilities and other services may also be positioned to enable easy access and connections between containers 602.

Airflow in warm air plenums 610, 612, 614 may be controlled via pressure sensors. For example, the fans may be controlled so that the pressure in warm air plenums is roughly equal to the pressure in workspaces 608. Taps for the pressure sensors may be placed in any appropriate location for approximating a pressure differential across the trays 620. For example, one tap may be placed in a central portion of plenum 612, while another may be placed on the workspace 608 side of a wall separating plenum 612 from workspace 608. For example the sensors may be operated in a conventional manner with a control system to control the operation of fans 622, 624, 626, 628. One sensor may be provided in each plenum, and the fans for a plenum or a portion of a plenum may be ganged on a single control point.

For operations, the system may better isolate problems in one area from other components. For instance, if a particular rack has trays that are outputting very warm air, such action will not affect a pressure sensor in the plenum (even if the fans on the rack are running at high speed) because pressure differences quickly dissipate, and the air will be drawn out of the plenum with other cooler air. The air of varying temperature will ultimately be mixed adequately in the plenum, in a workspace, or in an area between the plenum and the workspace.

FIG. 7 illustrates an example control loop 700 for controlling a data center cooling apparatus 712. In some aspects, control loop 700 can be implemented by, for example, the control engine 10a in system 1. In some implementations, the cooling apparatus 712 may be similar to, for example, the cooling unit 116 shown in FIG. 2A, or other cooling apparatus described in the present disclosure. In some implementations, the control loop 700 may control the cooling apparatus 712 to maintain and/or adjust a flow of cooling fluid to the cooling apparatus 712 to meet an approach temperature set point of the cooling apparatus 712. The approach temperature set point, in some implementations, may be a difference between a leaving air temperature from the cooling apparatus 712 and an entering cooling fluid temperature to the cooling apparatus 712. In some implementations, the illustrated cooling apparatus 712 may represent multiple cooling units in the data center, such as, for example, a group of cooling units, several groups of cooling units, or all of the cooling units in the data center.

As illustrated, the control loop 700 includes an input value 702 and a feedback value 714 that are provided to a summing function 704. In some implementations, the input value 702 may represent a desired valve position (e.g., percentage open value) of a particular valve (or group of valves) associated with a particular cooling apparatus 712 in the data center. For example, the desired valve position may be 100% open. In some implementations, the desired valve position may be about 95% open, thereby providing for some headroom for control of the valve.

The feedback value 714, in the illustrated implementation, may represent the valve position (i.e., percent open) of the particular valve associated with the cooling apparatus 712. For example, the particular valve may be "X" percentile valve as determined based on flow rate data in the data center. In some implementations, the particular valve may be the $2^{nd}$ percentile control valve, meaning that about 98% of the valves associated with cooling apparatus in the data center are at, or are less than, the valve position (i.e., percent open) of the $2^{nd}$ percentile valve.

The summing function 704 compares the input value 702 and the feedback value 714 and provides an output value 706 to a controller 708. Of course, in some implementations, the summing function 704 is implemented by the controller 708. In some implementations, the controller 708 may be a main controller of the cooling system of the data center, which is communicably coupled to each control valve of the data center and/or the individual controllers associated with the control valves. For example, the main controller may be a master controller communicably coupled to slave controllers at the respective control valves. In some implementations, the controller 708 may be a Proportional-Integral-Derivative (PID) controller. Alternatively, other control schemes, such as PI or otherwise, may be utilized. As another example, the control scheme may be implemented by a controller utilizing a state space scheme (e.g., a time-domain control scheme) representing a mathematical model of a physical system as a set of input, output and state variables related by first-order differential equations.

The controller 708 receives and/or determines the output value 706 (e.g., a difference between the input value 702 and the feedback value 714). Based on the output value 706, the controller 708 may adjust an approach temperature set point 710 communicated to the cooling apparatus 712. For example, if the output value 706 defines a difference between the input value 702 and the feedback value 714 greater than a threshold value (e.g., more than 1° C.), the approach temperature set point 710 may be adjusted by the controller 708.

If the feedback value 714 is less than the input value 702 (i.e., the X percentile valve is less open than desired), then the controller 708 may adjust the approach temperature set point 710 downward (i.e., decreased), thereby causing the control valve or valves to open and circulate more cooling fluid to the cooling apparatus 712. Alternatively, if the feedback value 714 is more than the input value 702 (i.e., the X percentile valve is more open than desired), then the controller 708 may adjust the approach temperature set point 710 upward (i.e., increased), thereby causing the control valve or valves to close and circulate less cooling fluid to the cooling apparatus 712.

FIG. 8 illustrates an example process 800 for cooling a data center based on an approach temperature. In some aspects, process 800 can be implemented by, for example, the control engine 10a in system 1. Process 800 may be implemented, for example, by or with a cooling system for a data center, such as, for example, the cooling systems 100 and/or 600 illustrated in FIGS. 2A and 6, respectively, as well as a cooling system including the cooling unit 116, the cooling unit 300, or other cooling unit in accordance with the present disclosure.

Process 800 may begin at step 802, when a cooling fluid is circulated to multiple cooling units in a data center having electronic equipment supported in multiple racks. The racks, in some implementations, may be in the form of open bays (e.g., open at front and back sides to an ambient workspace and warm air plenum, respectively). The racks may therefore be serviceable from one or both of the front or back sides during operation (e.g., while cooling airflow is circulated through the racks) of the racks and cooling system. In some implementations, the cooling fluid may be a chilled liquid, such as water, glycol, ammonia, or another liquid. In some implementations, the cooling fluid may be a cool liquid, such as a condenser water flow from, for example, a cooling tower, an evaporative cooling tower, a chiller condenser, or other condenser. In some implementations, the cooling fluid may be a mixed flow of, for example, chilled water supplied from a cooling plant and chilled water returned to a cooling plant.

In step 804, air is circulated from an ambient workspace adjacent the racks across a sub-set of the electronic equipment supported in the racks. In some implementations, air may be circulated through the racks by one or more fans of the cooling units. Alternatively, or in addition, air may be circulated over the racks (at least partially) by one or more air moving devices mounted on or adjacent computer servers in the racks.

In step 806, a temperature of the air leaving the cooling unit (i.e., leaving air temperature or "LAT") is determined. Measurement of the air leaving the cooling unit may be via, for example, a temperature sensor (e.g., thermocouple, digital sensor, analog sensor or otherwise) mounted at or near one or more fans of the cooling unit. In some implementations, the air temperature may be measured at a leaving edge (i.e., a cold face) of one or more cooling coils of the cooling unit. In some implementations, alternatively, the air temperature may be measure in the ambient workspace near the cooling unit.

In step 808, a temperature of the cooling fluid circulated to the cooling unit (i.e., entering fluid temperature or "EFT") is determined. In some implementations, for example, a temperature sensor may be arranged in a cooling fluid supply conduit circulating the cooling fluid to one or more cooling coils of the cooling unit. In some implementations, a difference between the LAT and EFT may be defined as an approach temperature of the cooling unit. For example, in some implementations, the LAT may be approximately 78° F. while the EFT may be approximately 55° F., providing for an approach temperature of 22° F. However, in other implementations, the EFT may be approximately 64° F., providing for an approach temperature of 14° F. In some implementations, the approach temperature of the cooling unit may be set to a particular value, e.g., about 14° F., in order to maximize an efficiency of the cooling unit. Further, in some implementations, a data center with multiple cooling units may have a single approach temperature set point for all of the cooling units, a unique approach temperature set point for each cooling unit, and/or unique approach temperature set points for groups of cooling units among the multiple cooling units in the data center. By having unique approach temperature set points for each cooling unit or a group of cooling units, an amount of cooling fluid available to the cooling units of the data center (e.g., pumped from one or more central cooling plants) may be maximized.

In step 810, a flow rate of the cooling fluid circulated to the cooling unit based on an approach temperature set point of the cooling unit is maintained. For example, in some implementations, as the cooling unit operates to provide cooling air to the data center and electronic equipment in the racks, a control valve disposed in the cooling fluid supply conduit to the cooling unit may be modulated help meet the approach temperature set point. For example, a controller of the control valve may automatically modulate the valve so that the approach temperature set point is maintained.

In step 812, the flow rate of the cooling fluid circulated to the cooling unit is modulated based on a change in the approach temperature set point. For example, in some implementations (some of which are described more fully with reference to FIGS. 8-9), the approach temperature to the cooling unit may be adjusted according to, for example, outside weather temperature, data center environmental conditions, and/or available or instantaneous cooling requirements/capacity, to name but a few. For example, in some implementations, a controller (e.g., a main controller communicably coupled to individual controllers coupled to control valves of the cooling units) may monitor a percentage open position of the control valves of respective cooling units in the data center.

The controller may monitor the positions of the valves to determine whether a predetermined percentile valve (e.g., the $95^{th}$ percentile valve within the multiple control valves associated with cooling units in the data center) are at a predetermined position (e.g., about 95% open). If, for example, the 95th percentile valve is only at 75% open, then the approach temperature set point may be lowered (i.e., decreased). By lowering the set point, for instance, the $95^{th}$ percentile control valve may be modulated toward a fully open position. Alternatively, all or a group of the control valves may be modulated toward an open position when the approach temperature set point is adjusted downward until the 95th percentile valve reaches about 95% open. Thus, more cooling fluid would be circulated to one or more of the cooling units, thereby making the LAT decrease as it is circulated through the cooling unit.

If, for example, the 95th percentile valve is at 100% open, then the approach temperature set point may be raised (i.e., increased). By raising the set point, for instance, the $95^{th}$ percentile control valve may be modulated toward a fully closed position (i.e., towards about 95% open). Alternatively, all or a group of the control valves may be modulated away from an open position when the approach temperature set point is adjusted upward until the $95^{th}$ percentile valve reaches about 95% open. Less cooling fluid would be circulated to one or more of the cooling units, thereby making the LAT increase as it is circulated through the cooling unit.

FIGS. 9-10 illustrate example processes 900 and 1000, respectively, for adjusting an approach temperature to cool a data center. Turning to FIG. 9, process 900 may be implemented, for example, by or with the system 1 and a cooling system for a data center, such as, for example, the cooling systems 200 and/or 600 illustrated in FIGS. 2A and 6, respectively, as well as a cooling system including the cooling unit 116, the cooling unit 300, or other cooling unit in accordance with the present disclosure. Further, process 900 may be implemented in addition with, or alternatively to, one or more processes to adjust an approach temperature set point as described with reference to FIG. 7 or 8 above.

In step 902, an aggregate data center power load is measured. For example, the aggregate data center power load may represent an amount of electrical power used by electrical equipment (e.g., servers in racks) in the data center.

In step 904, outside ambient conditions may be measured. In some implementations, an outside temperature, humidity, and/or enthalpy of the environment outside of a data center may be measured. For instance, such outside ambient conditions may determine, at least partially, a cooling load on the data center along with the amount of electrical power used by the electrical equipment. The outside ambient conditions may, for instance, determine an external cooling load on the data center due to infiltration, conduction through the structure, and/or exhaust/outside air requirements (e.g., set by ASHRAE standards). The amount of electrical power used by the electrical equipment may determine an internal cooling load on the data center. The sum of the internal and external cooling loads may determine at least an approximate amount of total cooling load on the data center. The total cooling load may be provided by the cooling units in the data center, which circulate cool air to the workspace and racks to alleviate the cooling load. Heat in the data center due to the total cooling load is transferred to the cooling fluid circulated to the cooling units In step 906, an available volume of cooling fluid is determined. The available volume of cooling fluid may be, for example, a maximum amount of volumetric flow (e.g., gallons per minute) of cooling fluid that may be circulated to the cooling units of the data center. This may be determined, for example, by reference to a maximum pumping capacity of one or more pumps circulating the cooling fluid, a measured maximum flow rate through a cooling fluid delivery system (e.g., by a flow meter installed in a cooling fluid conduit, such as the flow meter 150 illustrated in FIG. 2B), or otherwise.

In step 908, an amount of cooling fluid per unit of cooling load is determined. In some implementation, the cooling load may include a total cooling load or, alternatively, a cooling load from the electronic equipment in the racks of the data center. Thus, in some implementation, the amount of cooling fluid per unit of cooling load may be an amount of cooling fluid (e.g., GPM) per electrical power converted to heat by the electronic equipment (e.g., kW).

In step 910, the approach temperature set point is determined according to, for example, the determined cooling fluid per unit of cooling power. For instance, in some implementations, the approach temperature set point is determined based on a particular airside temperature between (e.g. midway between or otherwise) a maximum allowable temperature of the ambient air 124 and a minimum allowable temperature of the ambient air 124 and a fluid side temperature about equal to a nominal entering fluid temperature (e.g., the cooling fluid supply 132).

In step 912, a determination is made whether the determined approach temperature set point varies from, for example, a current approach temperature set point. As another example, it may be determined whether the determined approach temperature set point varies from a predetermined approach temperature set point. If the determination is made that the determined approach temperature set point does not vary from the current approach temperature set point and/or predetermined temperature set point, then the process 900 returns to step 900. If the determination is made that the determined approach temperature set point does vary from the current approach temperature set point and/or predetermined temperature set point, then at step 914, the approach temperature set point on one or more cooling units in the data center is updated (e.g., through a main controller coupled to controllers of control valves associated with respective cooling units). Process 900 may return to step 902.

Turning to FIG. 10, process 1000 may be implemented, for example, by or with a cooling system for a data center, such as, for example, the system 1 and cooling systems 200 and/or 500 illustrated in FIGS. 2A and 5, respectively, as well as a cooling system including the cooling unit 116, the cooling unit 300, or other cooling unit in accordance with the present disclosure. Further, process 1000 may be implemented in addition with, or alternatively to, one or more processes to adjust an approach temperature set point as described with reference to FIG. 7 or 8 above.

At step 1002, an aggregate cooling fluid volume circulated to cooling units in a data center is measured. In some implementations, for example, a flow meter (e.g., mechanical flow meter such as a turbine flow meter, pressure-based flow meter such as a venture, or another type of flow meter) may be located in a main conduit for circulating fluid to all or most of the cooling units in the data center to measure the aggregate cooling fluid volume. In some implementations, a relative speed (e.g., RPM) of a pump circulating the cooling fluid through the main conduit may be measured to determine a volumetric flow of cooling fluid delivered to the cooling units (e.g., by reference to a pump curve). In some implementations, flow meters may be associated with respective cooling units and flow rates of cooling fluid delivered to the cooling units may be measured and aggregated, for example, via a main controller of the cooling system for the data center.

In some implementations, the cooling fluid may be circulated to the cooling units at a flow rate to maintain a predetermined approach temperature at the cooling units (e.g., a difference between a leaving air temperature from the cooling unit and an entering cooling fluid temperature to the cooling unit). For example, each cooling unit may have an associated control valve that modulates to maintain the specified approach temperature set point. In some implementations, each cooling unit in the data center may have the same approach temperature set point. In some implementations, each cooling unit may be controlled to a unique approach temperature set point. In still further implementations, particular groups of cooling units may be controlled (e.g., by modulating the control valve associated with each cooling unit) according to a particular approach temperature set point.

In step 1004, the measured aggregate cooling fluid volume is compared against a threshold value. For example, in some implementations, the measured volume (or volumetric flow rate value) is compared to a pre-stored value by a main controller of the data center cooling system. In step 1006, a determination is made whether the measured aggregate cooling fluid volume is greater than the threshold value. If the measured aggregate cooling fluid volume is greater than the threshold value, then the approach temperature set point is adjusted downward (i.e., decreased) by a set amount (e.g., 1° C., 0.5° C., 0.25° C., 2° C., or other value). The resultant action, in some implementations, may be that one or more of the control valves may be modulated toward an open position, thereby allowing more cooling fluid to circulate to the cooling units. This may, in turn, allow the leaving air temperature to approach the entering cooling fluid temperature. The process 1000 may then return to step 1002.

If the measured aggregate cooling fluid volume is not greater than the threshold value, then a determination is made whether the measured aggregate cooling fluid volume is less than the threshold value in step 1008. If the measured aggregate cooling fluid volume is less than the threshold value, then the approach temperature set point is adjusted upward (i.e., increased) by a set amount (e.g., 1° C., 0.5° C., 0.25° C., 2° C., or other value). The resultant action, in some implementations, may be that one or more of the control valves may be modulated toward a closed position, thereby allowing less cooling fluid to circulate to the cooling units. This may, in turn, allow the leaving air temperature to depart from the entering cooling fluid temperature. The process 1000 may then return to step 1002.

A number of implementations have been described. Nevertheless, it will be understood that various modifications may be made. For example, various combinations of the components described herein may be provided for implementations of similar apparatuses. Further, in some example implementations of the cooling apparatus described herein, a liquid-to-liquid heat exchanger may be included in addition to or in place of a fan and liquid-to-air heat exchanger in order to cool electronic equipment supported in one or more racks. For instance, the liquid-to-liquid heat exchanger may receive heat from the electronic equipment into a working liquid and transfer the heat to a cooling fluid. Accordingly, other implementations are within the scope of the present disclosure.

What is claimed is:

1. A computer-implemented method for controlling a data center cooling system, the method comprising:

polling a plurality of control devices associated with the data center cooling system for a respective state of each of the control devices, the plurality of control devices comprising a plurality of control valves, each of the control valves in fluid communication with a cooling fluid source and at least one air-to-liquid heat exchanger mounted in a modular cooling apparatus, wherein polling a plurality of control devices associated with the data center cooling system comprises polling a plurality of controllers communicably coupled to the plurality of control valves by a proxy, the proxy executed on at least one rack-mounted computing device of the data center;

receiving, from each of the plurality of control devices, a response that comprises the respective state;

aggregating the responses from the plurality of control devices;

executing a control algorithm that comprises the aggregated responses as an input to the algorithm and an output that comprises a setpoint of the plurality of control devices; and transmitting the output to the plurality of control devices.

2. The method of claim 1, wherein, each respective state comprises a valve position of each respective control valve, and the setpoint comprises a new valve position of each respective control valve.

3. The method of claim 1, wherein executing a control algorithm comprises:

determining a temperature of air leaving each respective modular cooling unit;

determining a temperature of the cooling fluid circulated to each respective modular cooling unit through the respective control valves;

determining an approach temperature that comprises a difference between the temperature of the air leaving each respective modular cooling unit and the temperature of the cooling fluid circulated to each respective modular cooling unit; and determining the new valve position based on the determined approach temperature and an approach temperature setpoint.

4. The method of claim 1, further comprising:

partitioning the at least one rack-mounted computing device into an authenticated portion and an unauthenticated portion, the authenticated portion executing a plurality of processing jobs received from networked computing devices external to the data center; and routing the responses and output through the unauthenticated portion.

5. The method of claim 1, further comprising:

executing a second control algorithm that comprises the aggregated responses as a second input to the second algorithm and a second output that comprises the setpoint of the plurality of control devices;

storing the second output; and based on a failure to transmit the output to the plurality of control devices, transmit the stored second output to the plurality of control devices.

6. The method of claim 5, wherein the second output is stored in a database that is physically separated from the data center.

7. The method of claim 1, further comprising:

determining a failure mode; and based on the failure mode, reverting the plurality of control devices to respective fail safe positions.

8. A system of one or more computers configured to perform operations comprising:

polling a plurality of control devices associated with the data center cooling system for a respective state of each of the control devices, the plurality of control devices comprising a plurality of control valves, each of the control valves in fluid communication with a cooling fluid source and at least one air-to-liquid heat exchanger mounted in a modular cooling apparatus, wherein polling a plurality of control devices associated with the data center cooling system comprises polling a plurality of controllers communicably coupled to the plurality of control valves by a proxy, the proxy executed on at least one rack-mounted computing device of the data center;

receiving, from each of the plurality of control devices, a response that comprises the respective state;

aggregating the responses from the plurality of control devices;

executing a control algorithm that comprises the aggregated responses as an input to the algorithm and an output that comprises a setpoint of the plurality of control devices; and transmitting the output to the plurality of control devices.

9. The system of claim 8, wherein, each respective state comprises a valve position of each respective control valve, and the setpoint comprises a new valve position of each respective control valve.

10. The system of claim 8, wherein executing a control algorithm comprises:

determining a temperature of air leaving each respective modular cooling unit;

determining a temperature of the cooling fluid circulated to each respective modular cooling unit through the respective control valves;

determining an approach temperature that comprises a difference between the temperature of the air leaving each respective modular cooling unit and the temperature of the cooling fluid circulated to each respective modular cooling unit; and determining the new valve position based on the determined approach temperature and an approach temperature setpoint.

11. The system of claim 8, wherein the operations further comprise:

partitioning the at least one rack-mounted computing device into an authenticated portion and an unauthenticated portion, the authenticated portion executing a plurality of processing jobs received from networked computing devices external to the data center; and routing the responses and output through the unauthenticated portion.

12. The system of claim 8, wherein the operations further comprise:

executing a second control algorithm that comprises the aggregated responses as a second input to the second algorithm and a second output that comprises the setpoint of the plurality of control devices;

storing the second output; and based on a failure to transmit the output to the plurality of control devices, transmit the stored second output to the plurality of control devices.

13. The system of claim 12, wherein the second output is stored in a database that is physically separated from the data center.

14. The system of claim 8, wherein the operations further comprise:

determining a failure mode; and based on the failure mode, reverting the plurality of control devices to respective fail safe positions.

15. A non-transitory computer storage medium encoded with a computer program, the program comprising instructions that when executed by one or more computers cause the one or more computers to perform operations comprising:

polling a plurality of control devices associated with the data center cooling system for a respective state of each of the control devices, the plurality of control devices comprising a plurality of control valves, each of the control valves in fluid communication with a cooling fluid source and at least one air-to-liquid heat exchanger mounted in a modular cooling apparatus, wherein polling a plurality of control devices associated with the data center cooling system comprises polling a plurality of controllers communicably coupled to the plurality of control valves by a proxy, the proxy executed on at least one rack-mounted computing device of the data center;

receiving, from each of the plurality of control devices, a response that comprises the respective state;

aggregating the responses from the plurality of control devices;

executing a control algorithm that comprises the aggregated responses as an input to the algorithm and an output that comprises a setpoint of the plurality of control devices; and transmitting the output to the plurality of control devices.

16. The non-transitory computer storage medium of claim 15, wherein, each respective state comprises a valve position of each respective control valve, and the setpoint comprises a new valve position of each respective control valve.

17. The non-transitory computer storage medium of claim 15, wherein executing a control algorithm comprises:

determining a temperature of air leaving each respective modular cooling unit;

determining a temperature of the cooling fluid circulated to each respective modular cooling unit through the respective control valves;

determining an approach temperature that comprises a difference between the temperature of the air leaving each respective modular cooling unit and the temperature of the cooling fluid circulated to each respective modular cooling unit; and determining the new valve position based on the determined approach temperature and an approach temperature setpoint.

18. The non-transitory computer storage medium of claim 15, wherein the operations further comprise:

partitioning the at least one rack-mounted computing device into an authenticated portion and an unauthenticated portion, the authenticated portion executing a plurality of processing jobs received from networked computing devices external to the data center; and routing the responses and output through the unauthenticated portion.

19. The non-transitory computer storage medium of claim 15, wherein the operations further comprise:

executing a second control algorithm that comprises the aggregated responses as a second input to the second algorithm and a second output that comprises the setpoint of the plurality of control devices;

storing the second output; and based on a failure to transmit the output to the plurality of control devices, transmit the stored second output to the plurality of control devices.

20. The non-transitory computer storage medium of claim 19, wherein the second output is stored in a database that is physically separated from the data center.

21. The non-transitory computer storage medium of claim 15, wherein the operations further comprise:

determining a failure mode; and based on the failure mode, reverting the plurality of control devices to respective fail safe positions.

22. A computer-implemented method for controlling a data center cooling system, the method comprising:

polling a plurality of control devices associated with the data center cooling system for a respective state of each of the control devices, the plurality of control devices comprising a plurality of control valves, each of the control valves in fluid communication with a cooling fluid source and at least one air-to-liquid heat exchanger mounted in a modular cooling apparatus;

receiving, from each of the plurality of control devices, a response that comprises the respective state;

aggregating the responses from the plurality of control devices;

executing a control algorithm that comprises the aggregated responses as an input to the algorithm and an output that comprises a setpoint of the plurality of control devices;

transmitting the output to the plurality of control devices;

executing a second control algorithm that comprises the aggregated responses as a second input to the second algorithm and a second output that comprises the setpoint of the plurality of control devices;

storing the second output; and based on a failure to transmit the output to the plurality of control devices, transmit the stored second output to the plurality of control devices.

23. The method of claim 22, wherein polling a plurality of control devices associated with the data center cooling system comprises polling a plurality of controllers communicably coupled to the plurality of control valves by a proxy, the proxy executed on at least one rack-mounted computing device of the data center.

24. The method of claim 22, wherein, each respective state comprises a valve position of each respective control valve, and the setpoint comprises a new valve position of each respective control valve.

25. The method of claim 22, wherein executing a control algorithm comprises:

determining a temperature of air leaving each respective modular cooling unit;

determining a temperature of the cooling fluid circulated to each respective modular cooling unit through the respective control valves;

determining an approach temperature that comprises a difference between the temperature of the air leaving each respective modular cooling unit and the temperature of the cooling fluid circulated to each respective modular cooling unit; and determining the new valve position based on the determined approach temperature and an approach temperature setpoint.

* * * * *